(12) United States Patent
Kato et al.

(10) Patent No.: US 8,624,692 B2
(45) Date of Patent: Jan. 7, 2014

(54) HIGH-FREQUENCY SIGNAL TRANSMISSION LINE

(71) Applicant: Murata Manufacturing Co., Ltd., Nagaokakyo (JP)

(72) Inventors: Noboru Kato, Nagaokakyo (JP); Shigeru Tago, Nagaokakyo (JP); Jun Sasaki, Nagaokakyo (JP); Satoshi Sasaki, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/739,076

(22) Filed: Jan. 11, 2013

(65) Prior Publication Data

US 2013/0127560 A1 May 23, 2013

Related U.S. Application Data

(63) Continuation of application No. PCT/JP2011/077930, filed on Dec. 2, 2011.

(30) Foreign Application Priority Data

| Dec. 3, 2010 | (JP) | ................................. | 2010-270123 |
| May 6, 2011 | (JP) | ................................. | 2011-103644 |
| Sep. 30, 2011 | (JP) | ................................. | 2011-218074 |

(51) Int. Cl.
*H03H 7/38* (2006.01)

(52) U.S. Cl.
USPC ............................................. 333/238; 333/33

(58) Field of Classification Search
USPC .................. 333/238, 246, 1, 4, 5, 33
See application file for complete search history.

(56) References Cited

FOREIGN PATENT DOCUMENTS

| JP | 2006-157646 A | 6/2006 |
| JP | 2007-123740 A | 5/2007 |
| JP | 2009-105207 A | 5/2009 |
| WO | 2010/103721 A1 | 9/2010 |
| WO | 2010/103722 A1 | 9/2010 |

OTHER PUBLICATIONS

English Translation JP2010-212438.*
Official Communication issued in International Patent Application No. PCT/JP2011/077930, mailed on Jan. 24, 2012.
Official Communication issued in Japanese Patent Application No. 2012-524420, mailed on Aug. 21, 2012.
Official Communication issued in corresponding Japanese Patent Application No. 2012-524420, mailed on Jun. 4, 2013.
Official Communication issued in corresponding Japanese Patent Application No. 2012-524420, mailed on Jan. 15, 2013.

* cited by examiner

*Primary Examiner* — Stephen Jones
(74) *Attorney, Agent, or Firm* — Keating & Bennett, LLP

(57) ABSTRACT

Unwanted radiation is reduced in a high-frequency signal transmission line that includes a ground conductor provided with an opening that overlaps a signal line. A dielectric element assembly has a relative dielectric constant ∈1 and has a first principal surface and a second principal surface. A signal line is provided in the dielectric element assembly. A ground conductor is provided in the dielectric element assembly and on the first principal surface side with respect to the signal line, faces the signal line, and is provided with an opening that overlaps the signal line. A high dielectric constant layer has a relative dielectric constant ∈2 higher than the relative dielectric constant ∈1 and is provided on the first principal surface so as to overlap the opening.

11 Claims, 18 Drawing Sheets

HIGH-FREQUENCY SIGNAL TRANSMISSION LINE

BACKGROUND OF THE INVENTION

1. Field of the Invention

The present invention relates to a high-frequency signal transmission line and more particularly relates to a high-frequency signal transmission line including a ground conductor and a signal line.

2. Description of the Related Art

In a high-frequency signal transmission line having a stripline structure in which a signal line is sandwiched between ground conductors from above and below, due to the reason described below, the line width of the signal line is increased in order to decrease a high-frequency resistance value of the signal line. More specifically, when a high-frequency signal flows through the signal line, the high-frequency signal flows in a concentrated manner through the vicinity of the surface of the signal line due to a skin effect. In addition, when the high-frequency signal flows through the signal line, a high-frequency signal flows also through the ground conductors in a direction opposite to that of the high-frequency signal due to electromagnetic induction. The high-frequency resistance value of such a high-frequency signal decreases, if the surface area of the signal line and the area of a portion of each ground conductor which the signal line faces increase and conductor loss in the signal line and each ground conductor decreases. Therefore, in the high-frequency signal transmission line, the line width of the signal line is increased in order to decrease the high-frequency resistance value of the signal line.

However, when the line width of the signal line is increased, the area of a portion where the signal line and each ground conductor face each other increases, and a capacitance occurring between the signal line and the ground conductor increases. Thus, in order to set the high-frequency signal transmission line so as to have a predetermined impedance, the distance between the signal line and each ground conductor is increased and the capacitance is decreased. However, when the distance between the signal line and each ground conductor is increased, the thickness of the high-frequency signal transmission line increases and it becomes difficult to bend and use the high-frequency signal transmission line.

Thus, it is considered that the signal line and each ground conductor are not arranged to face each other. Hereinafter, this will be described in more detail with reference to the drawing. FIG. 18 is a diagram of a high-frequency signal transmission line 500 in which a signal line 502 is exposed from a ground conductor 504, as seen in a planar view from a lamination direction.

As shown in FIG. 18, the high-frequency signal transmission line 500 includes the signal line 502 and the ground conductors 504 and 506. The signal line 502 is a line-shaped conductor. The ground conductor 506 is provided on the lower side of the signal line 502 in the lamination direction and faces the signal line 502 through a dielectric layer. The ground conductor 504 is provided on the upper side of the signal line in the lamination direction and has an opening. The signal line 502 is located in the opening when being seen in a planar view from the upper side in the lamination direction.

In the high-frequency signal transmission line 500 shown in FIG. 18, the signal line 502 and the ground conductor 504 do not overlap each other when being seen in a planar view from the lamination direction. Thu, a capacitance occurring between the signal line 502 and the ground conductor 504 in the high-frequency signal transmission line 500 is smaller than a capacitance occurring between a signal line and a ground conductor in a high-frequency signal transmission line in which the signal line and the ground conductor overlap each other. Due to this, in the high-frequency signal transmission line 500, it is possible to decrease the distance between the signal line 502 and the ground conductor 504. As a result, in the high-frequency signal transmission line 500, the thickness of the high-frequency signal transmission line 500 can be decreased, and it becomes possible to bend and use the high-frequency signal transmission line 500.

However, the high-frequency signal transmission line 500 has a problem that unwanted radiation from the signal line 502 occurs. The signal line 502 does not overlap the ground conductor 504. Thus, an electromagnetic field generated by a current flowing through the signal line 502 is not absorbed by the ground conductor 504 and is radiated through the opening to the outside of the high-frequency signal transmission line 500, and unwanted radiation occurs.

As a high-frequency signal transmission line that can solve the above problem, for example, a flexible board described in Japanese Unexamined Patent Application Publication No. 2007-123740 is known. FIG. 19 is a diagram of a flexible board 600 described in Japanese Unexamined Patent Application Publication No. 2007-123740, as seen in a planar view from a lamination direction.

The flexible board 600 includes a signal line 602 and a ground layer 604. The signal line 602 is a line-shaped conductor. The ground layer 604 is laminated on the upper side of the signal line 602 in the lamination direction via a dielectric layer. In addition, although not shown, a ground layer is provided on the lower side of the signal line 602 in the lamination direction. In the flexible board 600, a plurality of openings 606 is provided in the ground layer 604. The openings 606 have rectangular shapes and are arranged on the signal line 602 in a line. Thus, the signal line 602 partially overlaps the ground layer 604 when seen in a planar view from the upper side in the lamination direction. As a result, in the flexible board 600, since the signal line 602 overlaps a portion of the ground conductor 604 where no opening is formed, unwanted radiation from the signal line 602 is reduced in this portion.

However, in the flexible board 600 described in Japanese Unexamined Patent Application Publication No. 2007-123740 as well, unwanted radiation occurs through the openings 606.

SUMMARY OF THE INVENTION

Therefore, preferred embodiments of the present invention significantly reduce and prevent unwanted radiation in a high-frequency signal transmission line that includes a ground conductor provided with an opening that overlaps a signal line.

A high-frequency signal transmission line according to an aspect of a preferred embodiment of the present invention includes an element assembly having a first relative dielectric constant and including a first principal surface and a second principal surface; a line-shaped signal line provided within the element assembly; a first ground conductor provided in the element assembly and on the first principal surface side with respect to the signal line and facing the signal line, the first ground conductor being provided with a first opening that overlaps the signal line; and a first high dielectric constant layer having a second relative dielectric constant higher than the first relative dielectric constant and provided on the first principal surface so as to overlap the first opening.

According to various preferred embodiments of the present invention, unwanted radiation is reduced in a high-frequency signal transmission line that includes a ground conductor provided with an opening that overlaps a signal line.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, high-frequency signal transmission lines according to preferred embodiments of the present invention will be described with reference to the drawings.
(Configuration of High-Frequency Signal Transmission Line)

Figure 1:
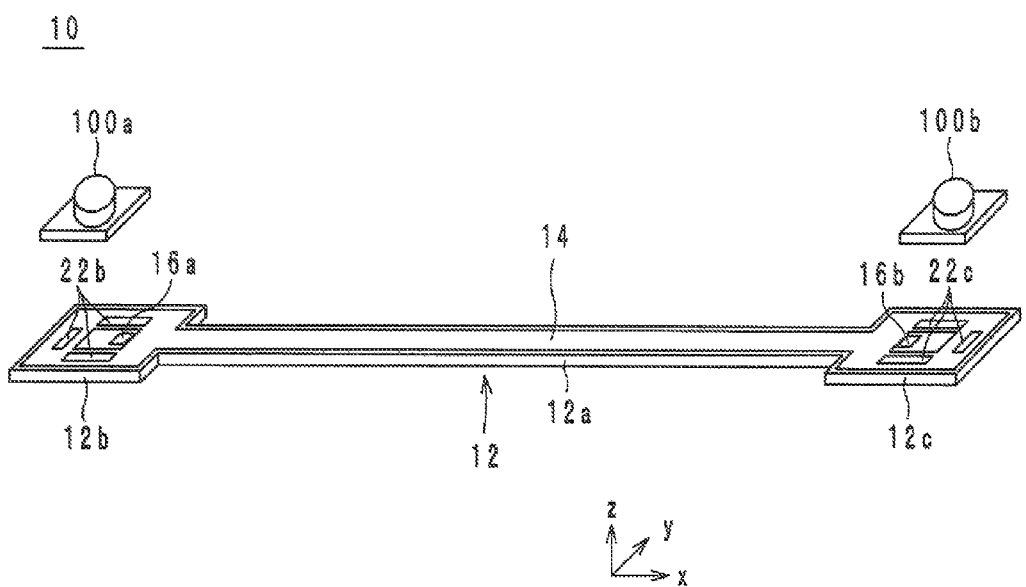
FIG. 1 is an external perspective view of a high-frequency signal transmission line according to a preferred embodiment of the present invention.
Figure 2:
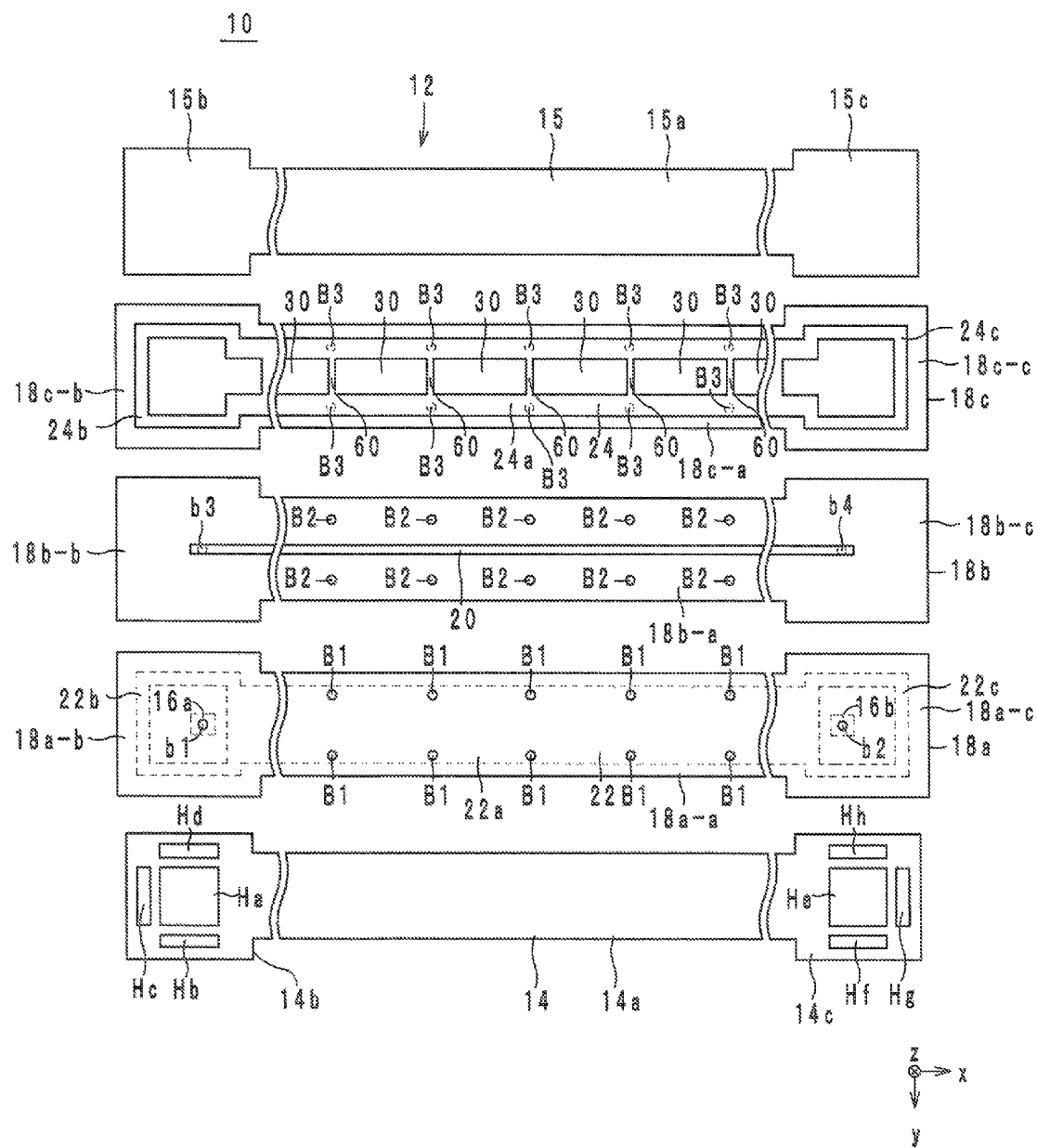
FIG. 2 is an exploded diagram of a dielectric element assembly of the high-frequency signal transmission line in FIG. 1.
Figure 3:
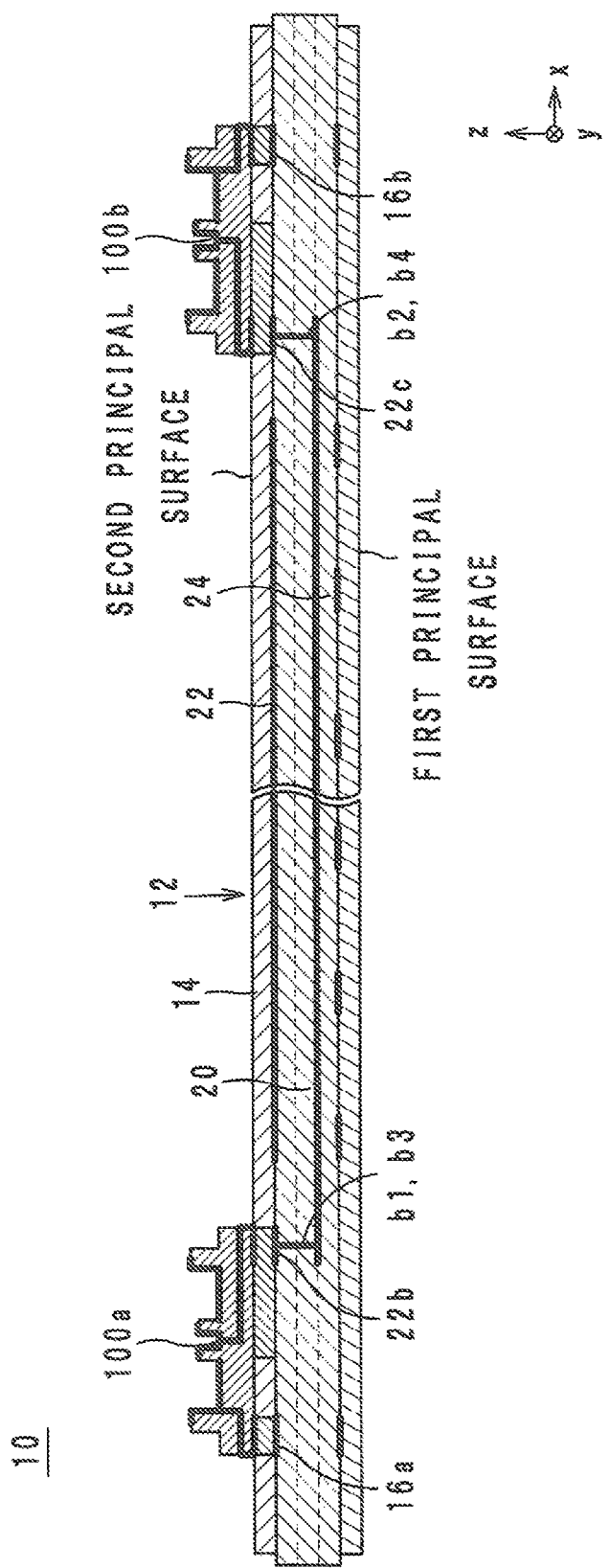
FIG. 3 is a cross-sectional structure diagram of the high-frequency signal transmission line in FIG. 1.
Figure 4:
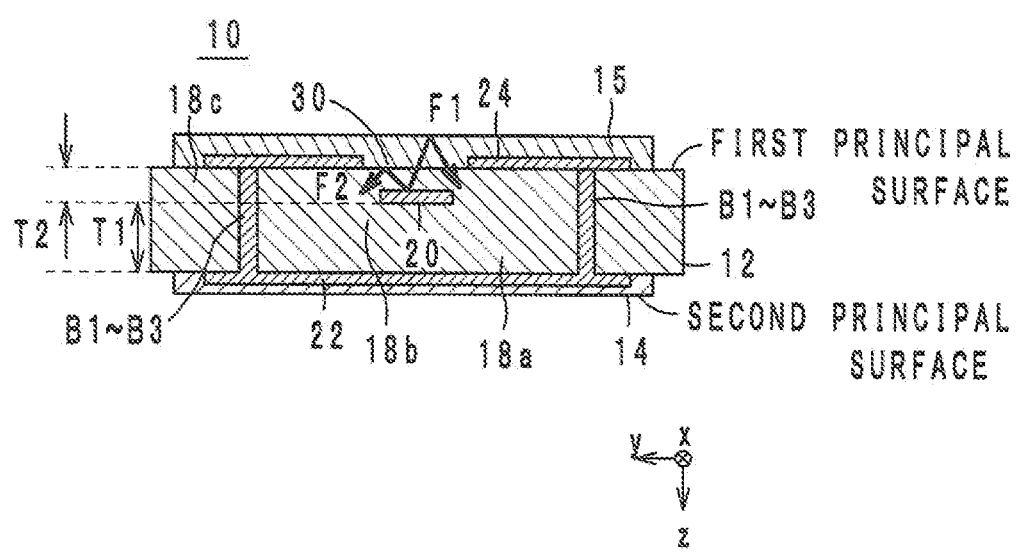
FIG. 4 is a cross-sectional structure diagram of the high-frequency signal transmission line.
Figure 5A:
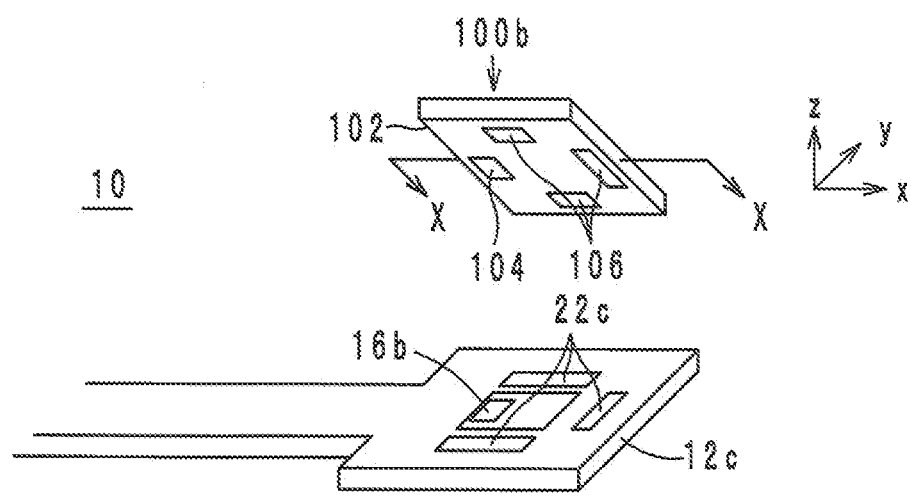
FIG. 5A is an external perspective view of a connector of the high-frequency signal transmission line.
Figure 5B:
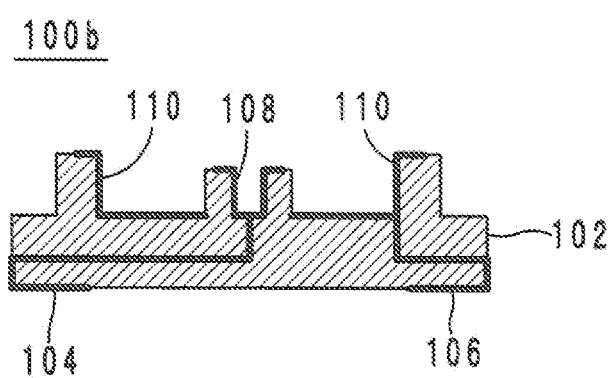
FIG. 5B is a cross-sectional structure diagram of a connector of the high-frequency signal transmission line.

Hereinafter, the configuration of a high-frequency signal transmission line according to a preferred embodiment of the present invention will be described with reference to the drawings. FIG. 1 is an external perspective view of the high-frequency signal transmission line 10 according to the preferred embodiment of the present invention. FIG. 2 is an exploded diagram of a dielectric element assembly 12 of the high-frequency signal transmission line 10 in FIG. 1. FIG. 3 is a cross-sectional structure diagram of the high-frequency signal transmission line 10 in FIG. 1. FIG. 4 is a cross-sectional structure diagram of the high-frequency signal transmission line 10. FIG. 5A is an external perspective view of a connector 100b of the high-frequency signal transmission line 10. FIG. 5B is a cross-sectional structure diagram of a connector 100b of the high-frequency signal transmission line 10. In FIGS. 1 to 5B, a lamination direction of the high-frequency signal transmission line 10 is defined as a z-axis direction. In addition, a longitudinal direction of the high-frequency signal transmission line 10 is defined as an x-axis direction, and a direction orthogonal to the x-axis direction and the z-axis direction is defined as a y-axis direction.

The high-frequency signal transmission line 10 is used, for example, for connecting two high-frequency circuits in an electronic device such as a cellular phone. As shown in FIGS. 1 to 3, the high-frequency signal transmission line 10 includes the dielectric element assembly 12, a protective layer 14, a high dielectric constant layer 15, external terminals 16 (16a and 16b), a signal line 20, ground conductors 22 and 24, via-hole conductors b1 to b4 and B1 to B3, and connectors 100a and 100b.

The dielectric element assembly 12 is a plate-shaped flexible member having two principal surfaces. The dielectric element assembly 12 extends in the x-axis direction when been seen in a planar view from the z-axis direction, and includes a line portion 12a and connection portions 12b and 12c. The dielectric element assembly 12 is a laminate composed of dielectric sheets (insulating material layers) 18 (18a to 18c) shown in FIG. 2 which are laminated in this order from the positive direction side to the negative direction side in the z-axis direction. The dielectric sheets 18 constituting the dielectric element assembly 12 are formed from a liquid crystal polymer and have a relative dielectric constant ∈1 of about 3. It is noted that other than the liquid crystal polymer, the dielectric sheets 18 can be formed from a thermoplastic resin having flexibility, such as polyimide. Hereinafter, as shown in FIG. 4, a principal surface of the dielectric element assembly 12 on the negative direction side in the z-axis direction is referred to as a front surface (first principal surface), and a principal surface of the dielectric element assembly 12 on the positive direction side in the z-axis direction is referred to as a back surface (second principal surface).

The line portion 12a extends in the x-axis direction. The connection portions 12b and 12c are connected to an end of the line portion 12a on the negative direction side in the x-axis direction and an end of the line portion 12a on the positive direction side in the x-axis direction, respectively, to form a rectangular shape. The widths of the connection portions 12b and 12c in the y-axis direction are larger than the width of the line portion 12a in the y-axis direction.

The dielectric sheets 18 extend in the x-axis direction when being seen in a planar view from the z-axis direction, and have the same shape as that of the dielectric element assembly 12. The total thickness T1 of the dielectric sheets 18a and 18b is larger than the thickness T2 of the dielectric sheet 18c as shown in FIG. 4. For example, after lamination of the dielectric sheets 18a to 18c, the thickness T1 is 50 to 300 µm. In the present preferred embodiment, the thickness T1 is 150 µm. In addition, the thickness T2 is 10 to 100 µm. In the present preferred embodiment, the thickness T2 is 50 µm. Hereinafter, a principal surface of each dielectric sheet 18 on the negative direction side in the z-axis direction is referred to as a front surface, and a principal surface of each dielectric sheet 18 on the positive direction side in the z-axis direction is referred to as a back surface.

In addition, the dielectric sheet 18a is composed of a line portion 18a-a and connection portions 18a-b and 18a-c. The dielectric sheet 18b is composed of a line portion 18b-a and connection portions 18b-b and 18b-c. The dielectric sheet 18c is composed of a line portion 18c-a and connection portions 18c-b and 18c-c. The line portions 18a-a, 18b-a, and 18c-a constitute the line portion 12a. The connection portions 18a-b, 18b-b, and 18c-b constitute the connection portion 12b. The connection portions 18a-c, 18b-c, and 18c-c constitute the connection portion 12c.

The external terminal 16a is a rectangular conductor provided near the center of the back surface of the connection portion 18a-b, as shown in FIGS. 1 and 2. The external terminal 16b is a rectangular conductor provided near the center of the front surface of the connection portion 18a-c, as shown in FIGS. 1 and 2. The external terminals 16a and 16b are produced from a metal material containing silver or copper as a principal component and having a low specific resistance. In addition, gold plating is applied to the front surfaces of the external terminals 16a and 16b.

The signal line 20 is a line-shaped conductor provided within the dielectric element assembly 12 as shown in FIG. 2, and extends on the front surface of the dielectric sheet 18b in the x-axis direction. Both ends of the signal line 20 overlap the external terminals 16a and 16b, respectively, when being seen in a planar view from the z-axis direction. The line width of the signal line 20 is, for example, 100 to 500 µm. In the present preferred embodiment, the line width of the signal line 20 is 240 µm. The signal line 20 is produced from a metal material containing silver or copper as a principal component and having a low specific resistance.

The ground conductor 24 (first ground conductor) is provided within the dielectric element assembly 12 and on the first principal surface side with respect to the signal line 20 (namely, on the negative direction side in the z-axis direction) as shown in FIG. 2, and more specifically, is provided on the front surface of the dielectric sheet 18c. Thus, the ground conductor 24 is provided on a first front surface of the dielectric element assembly 12. The ground conductor 24 extends on the front surface of the dielectric sheet 18c in the x-axis direction and faces the signal line 20 through the dielectric sheet 18c. The ground conductor 24 is produced from a metal material containing silver or copper as a principal component and having a low specific resistance.

In addition, the ground conductor 24 is composed of a line portion 24a and terminal portions 24b and 24c. The line portion 24a is provided on the front surface of the line portion 18c-a and extends in the x-axis direction. The line portion 24a has a ladder shape by alternately providing, along the signal line 20, a plurality of openings 30 where no conductor layer is formed and a plurality of bridge portions 60 that are portions where a conductor layer is formed. The openings 30 have rectangular shapes when being seen in a planar view from the z-axis direction, and overlap the signal line 20, as shown in FIGS. 2 and 4. Thus, the signal line 20 alternately overlaps the openings 30 and the bridge portions 60 when being seen in a planar view from the z-axis direction. In addition, the openings 30 are arranged at equal intervals.

The terminal portion 24b is provided on the front surface of the line portion 18c-b and formed in a rectangular ring. The terminal portion 24b is connected to an end of the line portion 24a on the negative direction side in the x-axis direction. The terminal portion 24c is provided on the front surface of the line portion 18c-c and formed in a rectangular ring. The terminal portion 24c is connected to an end of the line portion 24a on the positive direction side in the x-axis direction.

The ground conductor 22 (second ground conductor) is provided within the dielectric element assembly 12 and on the negative direction in the z-axis direction with respect to the signal line 20, as shown in FIG. 2, and more specifically, is provided on the back surface of the dielectric sheet 18a that is closest to the back surface of the dielectric element assembly 12. Thus, the ground conductor 22 is provided on a second front surface of the dielectric element assembly 12. The ground conductor 22 extends on the back surface of the dielectric sheet 18a in the x-axis direction and faces the signal line 20 through the dielectric sheets 18a and 18b. The ground conductor 22 faces the ground conductor 24 through the signal line 20. Substantially no opening is provided in a portion of the ground conductor 22 which faces the signal line 20. In other words, the ground conductor 22 is an electrode continuously extending along the signal line 20 in the line portion 12a in the x-axis direction, namely, is a so-called solid electrode. However, the ground conductor 22 does not need to fully cover the line portion 12a, and, for example, a micro hole or the like may be provided at a predetermined position in the ground conductor 22 for releasing gas that occurs when thermoplastic resins of the dielectric sheets 18 are thermocompression-bonded. The ground conductor 22 is produced from a metal material containing silver or copper as a principal component and having a low specific resistance.

In addition, the ground conductor 22 is composed of a line portion 22a and terminal portions 22b and 22c. The line portion 22a is provided on the back surface of the line portion 18a-a and extends in the x-axis direction. The terminal portion 22b is provided on the back surface of the line portion 18a-b and formed in a rectangular ring surrounding the periphery of the external terminal 16a. The terminal portion 22b is connected to an end of the line portion 22a on the negative direction side in the x-axis direction. The terminal portion 22c is provided on the back surface of the line portion 18a-c and formed in an annular rectangular shape surrounding the periphery of the external terminal 16b. The terminal portion 22c is connected to an end of the line portion 22a on the positive direction side in the x-axis direction.

As described above, the signal line 20 is sandwiched between the ground conductors 22 and 24 via the dielectric layers 18a to 18c from both sides in the z-axis direction. In other words, the signal line 20 and the ground conductors 22 and 24 form a tri-plate type stripline structure. In addition, the interval between the signal line 20 and the ground conductor 22 is substantially equal to the total thickness T1 of the dielectric sheets 18a and 18b as shown in FIG. 4, and is, for example, 50 μm to 300 μm. In the present preferred embodiment, the interval between the signal line 20 and the ground conductor 22 is 150 μm. Meanwhile, the interval between the signal line 20 and the ground conductor 24 is substantially equal to the thickness T2 of the dielectric sheet 18c as shown in FIG. 4, and is, for example, 10 μm to 100 μm. In the present preferred embodiment, the interval between the signal line 20 and the ground conductor 24 is 50 μm. In other words, the thickness T1 is designed so as to be larger than the thickness T2.

As described above, when the thickness T1 is made larger than the thickness T2, a capacitance occurring between the ground conductor 22 and the signal line 20 is reduced, and the line width of the signal line 20 for setting a predetermined impedance (e.g., 50Ω) can be increased. Thus, transmission loss can be reduced, and hence the electrical characteristics of the high-frequency signal transmission line can be improved. In the present preferred embodiment, a capacitance occurring between the ground conductor 22 and the signal line 20 is a main factor for impedance designing, and the ground conductor 24 is used as a ground conductor for reducing radiation of a signal, for impedance designing. In other words, with the ground conductor 22 and the signal line 20, a characteristic impedance is set so as to be high (e.g., 70Ω), and a region having a low impedance (e.g., 30Ω) is provided in a portion of the high-frequency signal transmission line by adding the ground conductor 24. By so doing, the impedance of the entire high-frequency signal transmission line is designed so as to be a predetermined impedance (e.g., 50Ω).

The via-hole conductors b1 and b3 extend through the connection portions 18a-b and 18b-b of the dielectric sheets 18a and 18b, respectively, in the z-axis direction to form a single via hole, and connect the external terminal 16a to an end of the signal line 20 on the negative direction side in the x-axis direction. The via-hole conductors b2 and b4 extend through the connection portions 18a-c and 18b-c of the dielectric sheets 18a and 18b, respectively, in the z-axis direction to form a single via-hole conductor, and connect the external terminal 16b to an end of the signal line 20 on the positive direction side in the x-axis direction. Thus, the signal line 20 is connected between the external terminals 16a and 16b. The via-hole conductors b1 to b4 are produced from a metal material containing silver or copper as a principal component and having a low specific resistance.

The via-hole conductors B1 to B3 extend through the line portions 18a-a to 18c-a of the dielectric sheets 18a to 18c, respectively, in the z-axis direction, and a plurality of the via-hole conductors B1, B2, or B3 is provided in each of the line portions 18a-a to 18c-a. The via-hole conductors B1 to B3 are connected to each other to form a single via-hole conductor and connect the ground conductor 22 to the ground conductor 24. The via-hole conductors B1 to B3 are produced from a metal material containing silver or copper as a principal component and having a low specific resistance.

The protective layer 14 covers the substantially entire back surface of the dielectric sheet 18a. Thus, the protective layer 14 covers the ground conductor 22. The protective layer 14 is formed from, for example, flexible resin such as a resist material.

In addition, the protective layer 14 is composed of a line portion 14a and connection portions 14b and 14c as shown in FIG. 2. The line portion 14a covers the entire back surface of the line portion 18a-a, thereby covering the line portion 22a.

The connection portion 14b is connected to an end of the line portion 14a on the negative direction side in the x-axis direction and covers the back surface of the connection portion 18a-b. However, openings Ha to Hd are provided in the connection portion 14b. The opening Ha is a rectangular opening provided at the center of the connection portion 14b. The external terminal 16a is exposed to the outside through the opening Ha. In addition, the opening Hb is a rectangular opening provided on the positive direction side of the opening Ha in the y-axis direction. The opening Hc is a rectangular opening provided on the negative direction side of the opening Ha in the x-axis direction. The opening Hd is a rectangular opening provided on the negative direction side of the opening Ha in the y-axis direction. The terminal portion 22b is exposed to the outside through the openings Hb to Hd, thereby serving as an external terminal.

The connection portion 14c is connected to an end of the line portion 14a on the positive direction side in the x-axis direction and covers the back surface of the connection portion 18a-c. However, openings He to Hh are provided in the connection portion 14c. The opening He is a rectangular opening provided at the center of the connection portion 14c. The external terminal 16b is exposed to the outside through the opening He. In addition, the opening Hf is a rectangular opening provided on the positive direction side of the opening He in the y-axis direction. The opening Hg is a rectangular opening provided on the positive direction side of the opening He in the x-axis direction. The opening Hh is a rectangular opening provided on the negative direction side of the opening He in the y-axis direction. The terminal portion 22c is exposed to the outside through the openings Hf to Hh, thereby serving as an external terminal.

The high dielectric constant layer 15 is provided on the first principal surface of the dielectric element assembly 12 and covers the substantially entire front surface of the dielectric sheet 18c. Thus, the high dielectric constant layer 15 covers the ground conductor 24 and overlaps the openings 30. For the high dielectric constant layer 15, for example, a material obtained by mixing a dielectric filler with polyimide is used, and the high dielectric constant layer 15 has a relative dielectric constant $\in 2$ higher than the relative dielectric constant $\in 1$ of the dielectric element assembly 12. The relative dielectric constant $\in 2$ of the high dielectric constant layer 15 is, for example, 4. It is desired that the relative dielectric constant $\in 2$ of the high dielectric constant layer 15 is high, and in order to suppress formation of a stray capacitance within the high-frequency signal transmission line 10, the relative dielectric constant $\in 2$ is desirably equal to or less than 10.

In addition, the high dielectric constant layer 15 is composed of a line portion 15a and connection portions 15b and 15c as shown in FIG. 2. The line portion 15a covers the substantially entire front surface of the line portion 18c-a, thereby covering the line portion 24a including a plurality of the openings 30.

The connection portion 15b is connected to an end of the line portion 15a on the negative direction side in the x-axis direction and covers the substantially entire front surface of the connection portion 18c-b. The connection portion 15c is connected to an end of the line portion 15a on the positive direction side in the x-axis direction and covers the substantially entire front surface of the connection portion 18c-c.

The connectors 100a and 100b are mounted on the back surfaces of the connection portions 12b and 12c, respectively. The connectors 100a and 100b have the same configuration, and thus will be described below with the configuration of the connector 100b as an example.

The connector 100b is composed of a connector body 102, external terminals 104 and 106, a central conductor 108, and an external conductor 110 as shown in FIGS. 1 and 5. The connector body 102 is formed in a shape in which a cylinder is connected to a rectangular plate, and is produced from insulating material such as resin.

The external terminal 104 is provided on a surface of the plate of the connector body 102 on the negative direction side in the z-axis direction and at a position facing the external terminal 16b. The external terminal 106 is provided on the surface of the plate of the connector body 102 on the negative direction side in the z-axis direction and at a position corresponding to the terminal portion 22c exposed through the openings Hf to Hh.

The central conductor 108 is provided at the center of the cylinder of the connector body 102 and connected to the external terminal 104. The central conductor 108 is a signal terminal to or from which a high-frequency signal is inputted or outputted. The external conductor 110 is provided on the inner peripheral surface of the cylinder of the connector body 102 and connected to the external terminal 106. The external conductor 110 is a ground terminal maintained at a ground potential.

The connector 100b configured as described above is mounted on the back surface of the connection portion 12c such that the external terminal 104 is connected to the external terminal 16b and the external terminal 106 is connected to the terminal portion 22c. Thus, the signal line 20 is electrically connected to the central conductor 108. In addition, the ground conductors 22 and 24 are electrically connected to the external conductor 110.

Figure 6A:
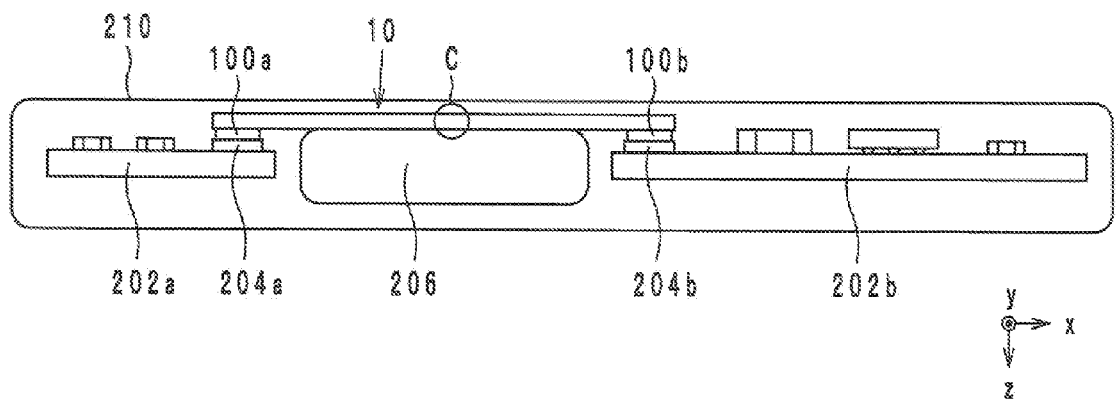
FIG. 6A is diagram of an electronic device in which the high-frequency signal transmission line is used, as seen in a planar view from a y-axis direction.
Figure 6B:
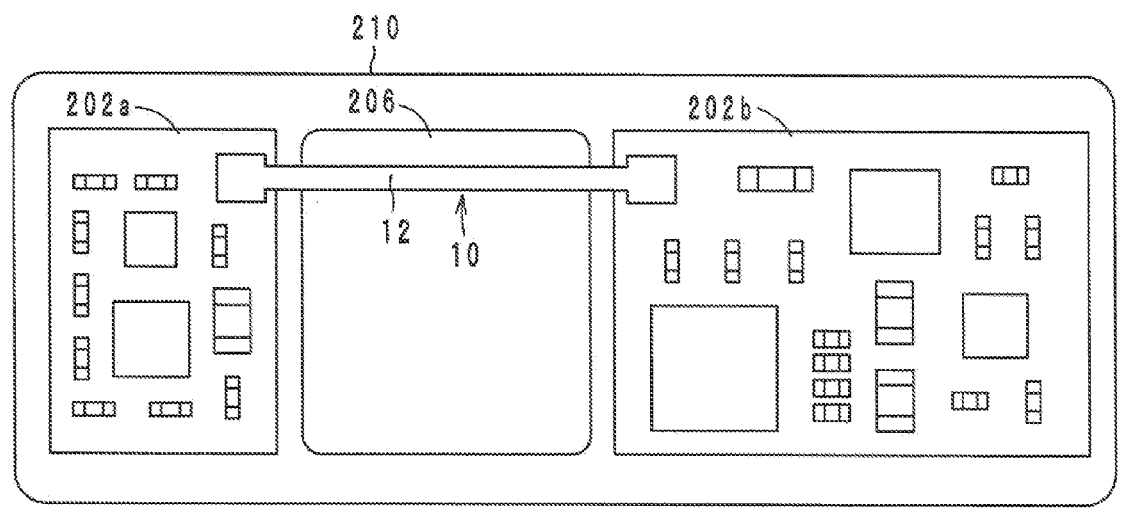
FIG. 6B is diagram of an electronic device in which the high-frequency signal transmission line is used, as seen in a planar view from a z-axis direction.

The high-frequency signal transmission line 10 is used as described below. FIG. 6A is diagrams of an electronic device 200 in which the high-frequency signal transmission line 10 is used, as seen in a planar view from the y-axis direction. FIG. 6B is diagrams of an electronic device 200 in which the high-frequency signal transmission line 10 is used, as seen in a planar view from the z-axis direction.

The electronic device 200 includes the high-frequency signal transmission line 10, circuit boards 202a and 202b, receptacles 204a and 204b, a battery pack (metal body) 206, and a housing 210.

For example, a transmission circuit or reception circuit including an antenna is provided on the circuit board 202a. For example, a power supply circuit is provided on the circuit board 202b. The battery pack 206 is, for example, a lithium ion secondary battery and has a structure in which a front surface thereof is covered with a metal cover. The circuit board 202a, the battery pack 206, and the circuit board 202b are arranged in order from the negative direction side to the positive direction side in the x-axis direction.

The receptacles 204a and 204b are provided on the principal surfaces of the circuit boards 202a and 202b, respectively, on the negative direction side in the z-axis direction. The receptacles 204a and 204b are connected to the connectors 100a and 100b, respectively. Thus, a high-frequency signal transmitted between the circuit boards 202a and 202b and having a frequency of, for example, 2 GHz is applied to the central conductors 108 of the connectors 100a and 100b via the receptacles 204a and 204b. In addition, the external conductor 110 of the connectors 100a and 100b are maintained at the ground potential via the circuit boards 202a and 202b and the receptacles 204a and 204b. Thus, the high-frequency signal transmission line 10 electrically and physically connect between the circuit boards 202a and 202b.

Here, the protective layer 14 is in contact with the battery pack 206 as shown in FIG. 6A and FIG. 6B. The protective layer 14 and the battery pack 206 are fixed to each other by means of an adhesive or the like. The protective layer 14 is located on the ground conductor 22 side with respect to the signal line 20. Thus, the solid ground conductor 22 (extending continuously in the x-axis direction) is located between the signal line 20 and the battery pack 206.

(Method for Manufacturing High-Frequency Signal Transmission Line)

Hereinafter, a method for manufacturing the high-frequency signal transmission line 10 will be described with reference to FIG. 2. In the following, the case where a single high-frequency signal transmission line 10 is produced will be described as an example. However, in reality, a plurality of high-frequency signal transmission lines 10 is simultaneously produced by laminating and cutting large dielectric sheets.

First, the dielectric sheets 18 that have copper foil formed on the entireties of the surfaces thereof and are formed from thermoplastic resin are prepared. For example, the surfaces of the copper foils of the dielectric sheets 18 are smoothened by providing zinc plating for corrosion prevention thereon. The dielectric sheets 18 are liquid crystal polymers having thicknesses of 20 μm to 80 μm. In addition, the thickness of the copper foil is 10 μm to 20 μm.

Next, the external terminals 16 and the ground conductor 22 shown in FIG. 2 are formed on the back surface of the dielectric sheet 18a by a photolithographic process. Specifically, resists having the same shapes as those of the external terminals 16 (16a and 16b) and the ground conductor 22 shown in FIG. 2 are printed on the copper foil of the dielectric sheet 18a. Then, etching treatment is performed on the copper foil to remove the portion of the copper foil that is not covered with the resists. Then, the resists are removed. By so doing, the external terminals 16 and the ground conductor 22 as shown in FIG. 2 are formed on the front surface of the dielectric sheet 18a.

Next, the signal line 20 shown in FIG. 2 is formed on the front surface of the dielectric sheet 18b by a photolithographic process. In addition, the ground conductor 24 shown in FIG. 2 is formed on the front surface of the dielectric sheet 18c by a photolithographic process. These photolithographic processes are the same as the photolithographic process performed when forming the external terminals 16 and the ground conductor 22, and thus the description thereof is omitted.

Next, a laser beam is applied to locations on the dielectric sheets 18a to 18c where the via-hole conductors b1 to b4 and B1 to B3 are to be formed, to form through-holes. Then, the through-holes formed in the dielectric sheets 18a and 18b are filled with a conductive paste.

Next, the dielectric sheets 18a to 18c are stacked in order from the positive direction side to the negative direction side in the z-axis direction such that the ground conductor 22, the signal line 20, and the ground conductor 24 have a stripline structure. Then, heat and pressure are applied to the dielectric sheets 18a to 18c from the positive direction side and the negative direction side in the z-axis direction, to soften the dielectric sheets 18a to 18c to compression-bond and integrate the dielectric sheets 18a to 18c. The conductive paste filled in the through-holes is solidified to form the via-hole conductors b1 to b4 and B1 to B3 shown in FIG. 2. Each dielectric sheet 18 may be integrated to each other by means of an adhesive such as epoxy resin instead of thermocompression bonding. In addition, the via-hole conductors b1 to b4 and B1 to B3 may be formed by integrating the dielectric sheets 18, then forming through-holes, and filling the through-holes with a conductive paste or forming a plating film in the through-holes.

Next, a paste obtained by mixing a filler with polyimide is applied to the front surface of the dielectric sheet 18c to form the high dielectric constant layer 15.

Lastly, a resin (resist) paste is applied to the back surface of the dielectric sheet 18a to form the protective layer 14. Thus, the high-frequency signal transmission line 10 shown in FIG. 1 is obtained.

(Advantages)

According to the high-frequency signal transmission line 10 configured as described above, unwanted radiation can be reduced. More specifically, in the high-frequency signal transmission line 10, the high dielectric constant layer 15 has a relative dielectric constant $\in 2$ higher than the relative dielectric constant $\in 1$ of the dielectric element assembly 12 and is provided on the first principal surface of the dielectric element assembly 12 so as to overlap the openings 30 in the ground conductor 24. Thus, as described below, more electromagnetic fields radiated from the signal line 20 are reflected at the interface between the high dielectric constant layer 15 and an air layer into the high-frequency signal transmission line 10.

In a high-frequency signal transmission line according to a comparative example in which a dielectric sheet formed from the same material as that of the dielectric element assembly is laminated on the ground conductor 24, the difference in relative dielectric constant at the interface between the dielectric sheet and an air layer is $\in 1-1$. Meanwhile, in the high-frequency signal transmission line 10, the difference in relative dielectric constant at the interface between the high dielectric constant layer 15 and the air layer is $\in 2-1$. Since the relative dielectric constant $\in 2$ is higher than the relative dielectric constant $\in 1$, $\in 2-1$ is higher than $\in 1-1$. Here, when the difference in the relative dielectric constant at the interface increases, an amount of an electromagnetic field reflected at the interface increases. Thus, an amount of an electromagnetic field reflected at the interface of the high-frequency signal transmission line 10 is larger than an amount of an electromagnetic field at the interface of the high-frequency signal transmission line according to the comparative example. In other words, in the high-frequency signal transmission line 10, more electromagnetic fields are reflected at the interface between the high dielectric constant layer 15 and the air layer into the high-frequency signal transmission line 10, as indicated by an electromagnetic field F1 in FIG. 4, and thus leakage of an electromagnetic field as unwanted radiation to the outside of the high-frequency signal transmission line 10 is suppressed. Further, in the high-frequency signal transmission line 10, the same phenomenon as that at the interface between the high dielectric constant layer 15 and the air layer occurs also at the interface between the high dielectric constant layer 15 and the dielectric sheet 18c, as indicated by an electromagnetic field F2 in FIG. 4. Thus, in the high-frequency signal transmission line 10, unwanted radiation is more effectively reduced.

In addition, according to the high-frequency signal transmission line 10, a plurality of the openings 30 is provided in the ground conductor 24, and thus the high-frequency signal transmission line 10 can easily be bent.

In addition, according to the high-frequency signal transmission line 10, deviation of the characteristic impedance of the signal line 20 from a predetermined characteristic impedance (e.g., 50Ω) can be suppressed. More specifically, in the flexible board described in Japanese Unexamined Patent Application Publication No. 2007-123740, there is the possibility that an electromagnetic field will leak through the opening to the outside of the flexible board. Thus, when a dielectric body, a metal body, or the like is provided on the periphery of the flexible board, electromagnetic coupling occurs between the signal line of the flexible board and the dielectric body, the metal body, or the like. As a result, there is the possibility that the characteristic impedance of the signal line of the flexible board will deviate from a predetermined characteristic impedance.

Meanwhile, in the high-frequency signal transmission line 10, the back surface of the dielectric element assembly 12 which is located on the ground conductor 22 side with respect to the signal line 20 is in contact with the battery pack 206. In other words, the ground conductor 22 in which substantially no opening is formed is provided between the signal line 20 and the battery pack 206, and the ground conductor 24 in which the openings 30 are formed is not provided therebetween. Thus, occurrence of electromagnetic coupling between the signal line 20 and the battery pack 206 is suppressed. As a result, in the high-frequency signal transmission line 10, deviation of the characteristic impedance of the signal line 20 from a predetermined characteristic impedance is suppressed.

In addition, according to the high-frequency signal transmission line 10, it is possible to easily bend the high-frequency signal transmission line 10 due to the following reason as well. The characteristic impedance Z of the high-frequency signal transmission line 10 is represented by $\sqrt{(L/C)}$. L is an inductance value of the high-frequency signal transmission line 10 per unit length. C is a capacitance value of the high-frequency signal transmission line per unit length. The high-frequency signal transmission line 10 is designed such that Z becomes a predetermined characteristic impedance (e.g., 50Ω).

Here, in order to enable the high-frequency signal transmission line 10 to be easily bent, decreasing the thickness in the z-axis direction (hereinafter, referred to merely as thickness) of the high-frequency signal transmission line 10 is considered. However, when the thickness of the high-frequency signal transmission line 10 is decreased, the distances between the signal line 20 and the ground conductors 22 and 24 decrease, and the capacitance value C increases. As a result, the characteristic impedance Z becomes less than the predetermined characteristic impedance.

Thus, it is considered that the line width in the y-axis direction (hereinafter, referred to merely as line width) of the signal line 20 is decreased to increase an inductance value L of the signal line 20 and the facing area of the signal line 20 and the ground conductors 22 and 24 is decreased to decrease the capacitance value C.

However, it is difficult to accurately form the signal line 20 having a narrow line width.

Thus, in the high-frequency signal transmission line 10, the openings 30 are provided in the ground conductor 24. Due to this, the facing area of the signal line 20 and the ground conductor 24 decreases and the capacitance value C decreases. As a result, the high-frequency signal transmission line 10 can easily be bent while the characteristic impedance Z is maintained at the predetermined characteristic impedance.

In addition, according to the high-frequency signal transmission line 10, the high dielectric constant layer 15 is provided on the ground conductor 24. Due to this, the ground conductor 24 is not exposed to the outside on the high-frequency signal transmission line 10. Thus, even when another component is disposed on the front surface of the dielectric element assembly 12, the ground conductor 24 does not directly face the other component, and hence variation of the characteristic impedance of the signal line 20 is suppressed.

High-Frequency Signal Transmission Line
According to First Modified Example

Figure 7:
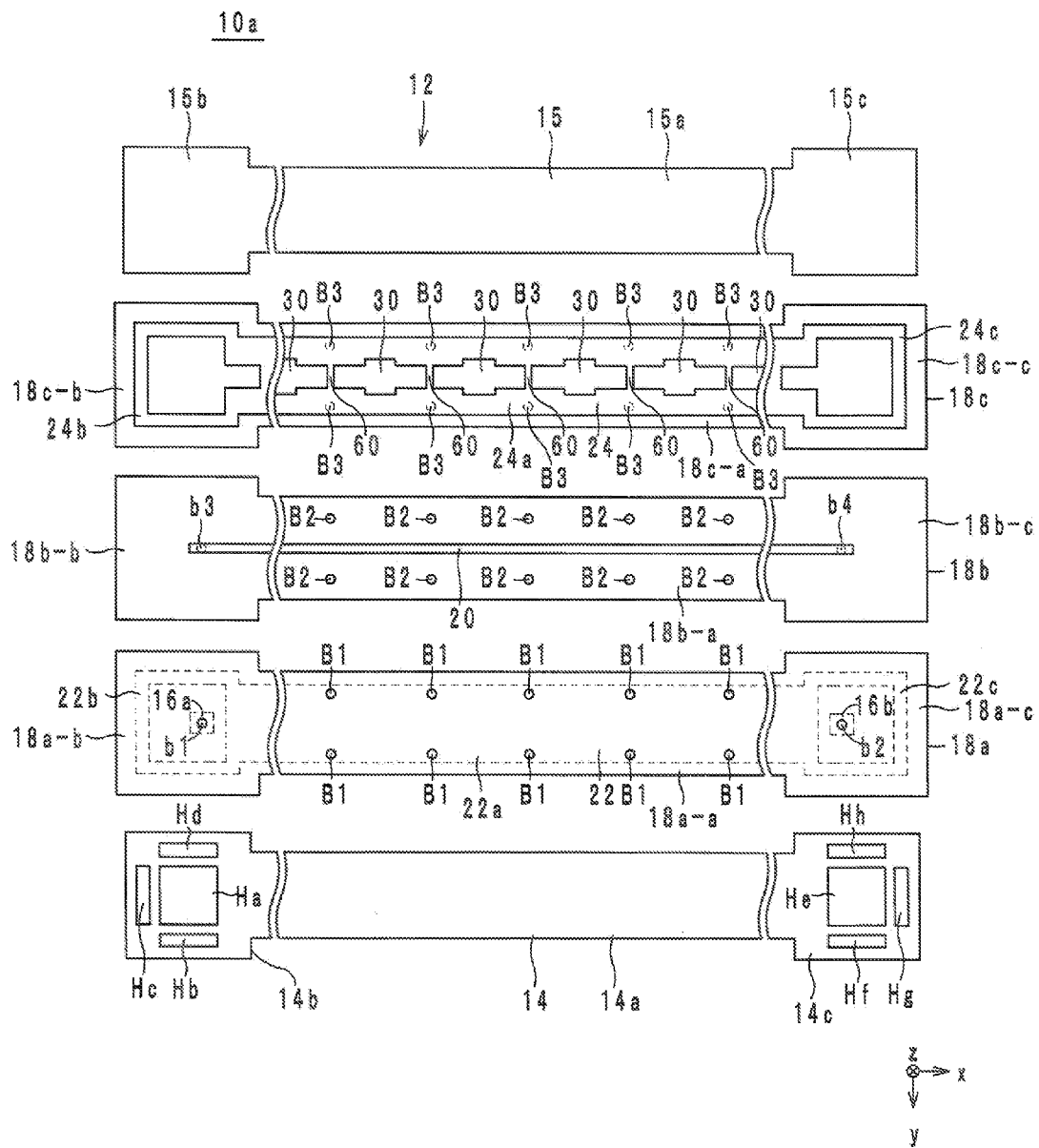
FIG. 7 is an exploded diagram of a laminate of a high-frequency signal transmission line according to a first modified example of a preferred embodiment of the present invention.
Figure 8:
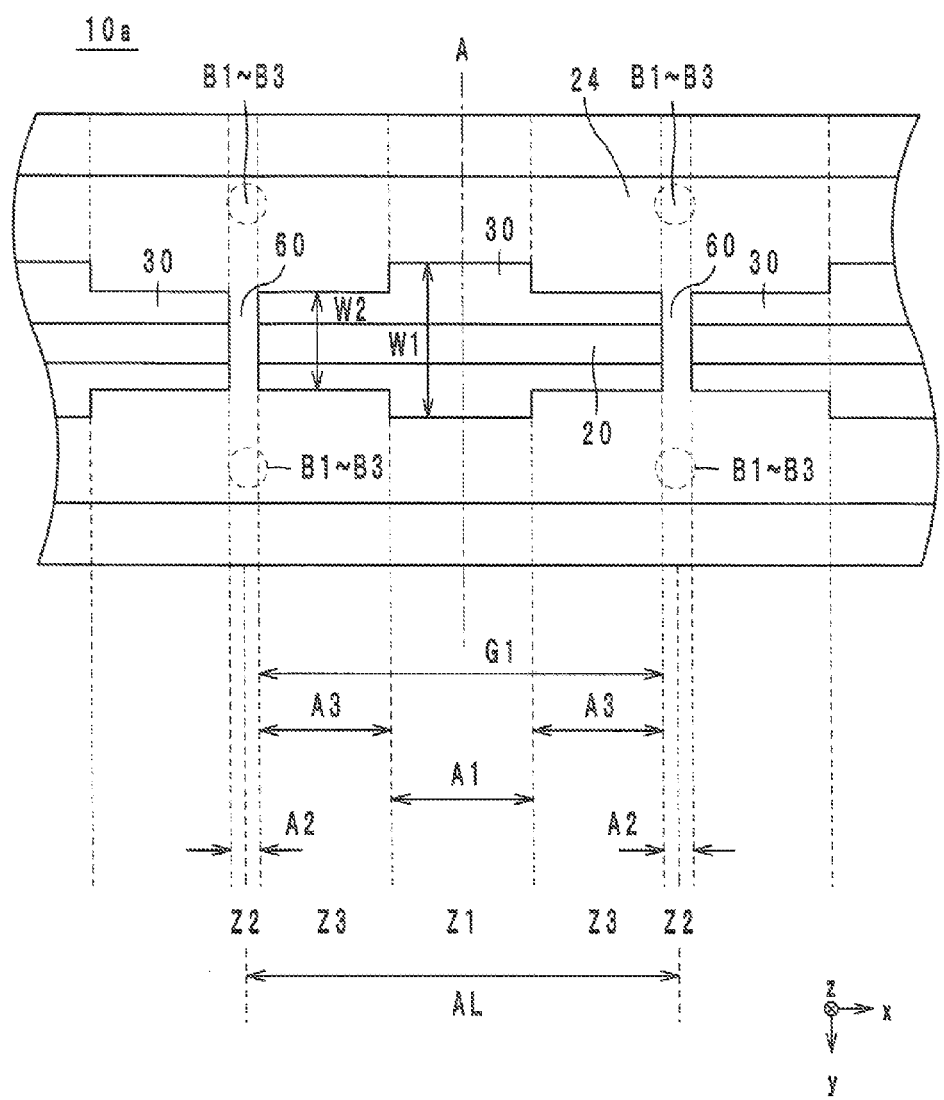
FIG. 8 is a diagram when the high-frequency signal transmission line in FIG. 7 is seen through from a z-axis direction.
Figure 9:
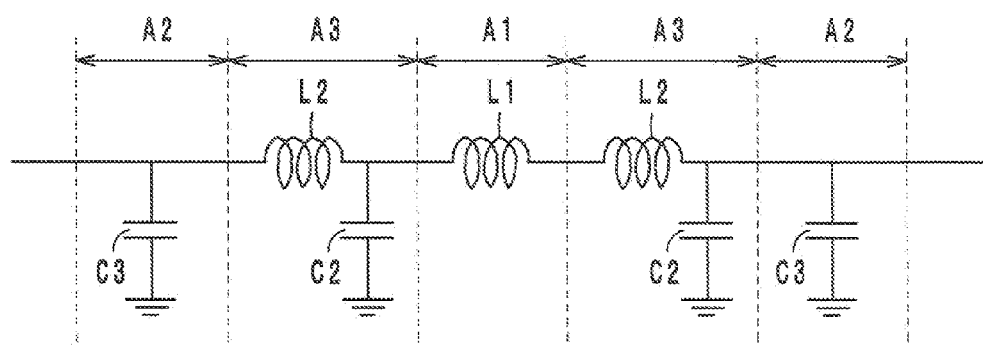
FIG. 9 is an equivalent circuit diagram of a portion taken out from the high-frequency signal transmission line according to the first modified example of a preferred embodiment of the present invention.

Hereinafter, the configuration of a high-frequency signal transmission line according to a first modified example will be described with reference to the drawings. FIG. 7 is an exploded diagram of the laminate 12 of the high-frequency signal transmission line 10a according to the first modified example. FIG. 8 is a diagram when the high-frequency signal transmission line 10a in FIG. 7 is seen through from the z-axis direction. FIG. 9 is an equivalent circuit diagram of a portion taken out from the high-frequency signal transmission line 10a according to the first modified example.

The difference between the high-frequency signal transmission line 10 and the high-frequency signal transmission line 10a is the shape of each opening 30. Hereinafter, the configuration of the high-frequency signal transmission line 10a will be described mainly with the difference.

The ground conductor 24 has a ladder shape by alternately providing a plurality of the openings 30 and a plurality of the bridge portions 60 along the signal line 20. The openings 30 overlap the signal line 20 as shown in FIG. 8, when being seen in a planar view from the z-axis direction, and each have a shape that is line-symmetrical about the signal line 20. In other words, the signal line 20 extends across the centers of the openings 30 in the y-axis direction.

Further, the openings 30 each have a shape that is line-symmetrical about a straight line A that passes through the centers of the openings 30 in the direction in which the signal line 20 extends (in the x-axis direction) and that is orthogonal to the signal line 20 (namely, extends in the y-axis direction). A detailed description will be given below.

A region including the center of each opening 30 in the x-axis direction is defined as a region A1. In addition, a region corresponding to each bridge portion 60 is defined as a region A2. Further, a region located between the region A1 and the region A2 is referred to as a region A3. The regions A3 are located on both sides of each region A1 in the x-axis direction and are each adjacent to the region A1 and the region A2. The length of each region A2 in the x-axis direction (i.e., the length of each bridge portion 60) is, for example, 25 to 200 μm. In the present preferred embodiment, the length of each region A2 in the x-axis direction is 100 μm.

The straight line A passes through the center of the region A1 in the x-axis direction as shown in FIG. 8. The width W1 of the opening 30 in the region A1 in a direction orthogonal to the signal line 20 (in the y-axis direction) is larger than the width W2 of the opening 30 in each region A3 in the y-axis direction. In other words, each opening 30 has a shape in which a central portion of the opening 30 in the x-axis direction is wider than any other portions of the opening 30, and has a shape that is line-symmetrical about the straight line A. In each opening 30, a region in which the width in the y-axis direction is the width W1 is the region A1, and regions in which the width in the y-axis direction is the width W2 are the regions A3. Thus, steps are present at the boundaries between the regions A1 and A3 of the opening 30. The width W1 is, for example, 500 to 1500 μm. In the present preferred embodiment, the width W1 is 900 μm. In addition, the width W2 is, for example, 250 to 750 μm. In the present preferred embodiment, the width W2 is 480 μm.

In addition, the length G1 of each opening 30 in the x-axis direction is, for example, 1 to 5 mm. In the present preferred embodiment, the length G1 is 3 mm. Here, the length G1 is longer than the width W1 that is the maximum width of each opening 30. The length G1 is preferably equal to or larger than twice that of the width W1.

In addition, in the ground conductor 24, no opening is provided between the adjacent openings 30. More specifically, in the region A2 sandwiched between the adjacent openings 30, the conductor layer (the bridge portion 60) uniformly extends and no opening is present.

In the high-frequency signal transmission line 10a configured as described above, between the adjacent two bridge portions 60, the characteristic impedance of the signal line 20 varies so as to increase to a minimum value Z2, an intermediate value Z3, and a maximum value Z1 in order and then decrease to the maximum value Z1, the intermediate value Z3, and the minimum value Z2 in order as distance from one bridge portion 60 increases toward the other bridge portion 60. More specifically, each opening 30 has a width W1 in the region A1, and has, in each region A3, a width W2 smaller than the width W1. Thus, the distance between the signal line 20 and the ground conductor 24 in the region A1 is larger than the distance between the signal line 20 and the ground conductor 24 in each region A3. Due to this, the intensity of a magnetic field occurring in the signal line 20 in the region A1 is greater than the intensity of a magnetic field occurring in the signal line 20 in each region A3, and an inductance component in the region A1 increases. In other words, the L factor is dominant in the region A1.

Further, the bridge portion 60 is provided in each region A2. Thus, the distance between the signal line 20 and the ground conductor 24 in each region A3 is larger than the distance between the signal line 20 and the ground conductor 24 in each region A2. Due to this, a capacitance occurring in the signal line 20 in each region A2 is greater than a capacitance occurring in the signal line 20 in each region A3, and the intensity of a magnetic field in each region A2 is less than the intensity of the magnetic field in each region A3. In other words, the C factor is dominant in each region A2.

Due to the above, the characteristic impedance of the signal line 20 is the maximum value Z1 in the region A1. In other words, each opening 30 has a width W1 at a position where the characteristic impedance of the signal line 20 is the maximum value Z1. In addition, the characteristic impedance of the signal line 20 is the intermediate value Z3 in each region A3. In other words, each opening 30 has a width W2 at positions where the characteristic impedance of the signal line 20 is the intermediate value Z3. Moreover, the characteristic impedance of the signal line 20 is the minimum value Z2 in each region A2.

Thus, the high-frequency signal transmission line 10a has a circuit configuration shown in FIG. 9. More specifically, in the region A1, almost no capacitance occurs between the signal line 20 and the ground conductor 24, and thus the characteristic impedance Z1 mainly occurs by an inductance L1 of the signal line 20. In addition, in each region A2, a large capacitance C3 occurs between the signal line 20 and the ground conductor 24, and thus the characteristic impedance Z2 mainly occurs by the capacitance C3. Further, in each region A3, a capacitance C2 smaller than the capacitance C3 occurs between the signal line 20 and the ground conductor 24, and thus the characteristic impedance Z3 occurs by an inductance L2 of the signal line 20 and the capacitance C2. Moreover, the characteristic impedance Z3 is, for example, 55Ω. The characteristic impedance Z1 is higher than the characteristic impedance Z3, and is, for example, 70Ω. The characteristic impedance Z2 is lower than the characteristic impedance Z3, and is, for example, 30Ω. In addition, the characteristic impedance of the entire high-frequency signal transmission line 10a is 50Ω.

According to the high-frequency signal transmission line 10a, between the adjacent two bridge portions 60, the characteristic impedance of the signal line 20 varies so as to increase to the minimum value Z2, the intermediate value Z3, and the maximum value Z1 in order and then decrease to the maximum value Z1, the intermediate value Z3, and the minimum value Z2 in order as distance from one bridge portion 60 increases toward the other bridge portion 60. Thus, decrease in thickness of the high-frequency signal transmission line 10a can be achieved, and even though the thickness is small, the electrode width of the signal line 20 can be increased. Thus, the surface areas of electrode portions in the signal line 20 and the ground conductors 22 and 24 where a high-frequency current flows can be increased, and the transmission loss of a high-frequency signal is decreased. In addition, as shown in FIG. 8, the length AL of one cycle (a region A1, two regions A2, and a region A3) is 1 to 5 mm and is small. Thus, even in a higher frequency range, unwanted radiation can be suppressed and the transmission loss can be improved. Further, since the regions A3 are located on both ends of the region A1, an intense magnetic field occurring due to a current flowing through the signal line 20 is not transmitted directly to each region A2. Thus, a ground potential in each region A2 is stabilized and the shielding effect of the ground conductor 24 is maintained. Due to this, occurrence of unwanted radiation can be suppressed. As a result, in the high-frequency signal transmission line 10a, even when the distances between the signal line 20 and the ground conductors 22 and 24 are decreased, the line width of the signal line 20 can be increased, and it is possible to decrease the thickness of the high-frequency signal transmission line 10a having decreased transmission loss and reduced unwanted radiation with the characteristic impedance maintained. Thus, it is possible to easily bend the high-frequency signal transmission line 10a, and it is possible to bend and use the high-frequency signal transmission line 10a.

In addition, according to the high-frequency signal transmission line 10a, the transmission loss can be reduced with stabilization of the ground potential in the ground conductor 24, and further shielding characteristics can be improved. More specifically, in the high-frequency signal transmission line 10a, the width W1 of each opening 30 in the region A1 is larger than the width W2 of the opening 30 in each region A3. Thus, in the high-frequency signal transmission line 10a, the magnetic field energy of the signal line 20 located in the region A1 is higher than the magnetic field energy of the signal line 20 located in each region A3. In addition, the magnetic field energy of the signal line 20 located in each region A2 is lower than the magnetic field energy of the signal line 20 located in each region A3. Thus, the characteristic impedance of the signal line repeatedly varies to Z2, Z3, Z1, Z3, Z2, . . . in order. Therefore, in the signal line 20, the variation of the magnetic field energy in portions adjacent to each other in the x-axis direction becomes gentle. As a result, the magnetic field energy becomes small in the boundary between the unit structures (the regions A1 to A3), the variation of the ground potential in the ground conductor is suppressed, and occurrence of unwanted radiation and the transmission loss of a high-frequency signal are suppressed. In other words, occurrence of an unwanted inductance component in each bridge portion 60 can be suppressed by each region A3. As a result, a mutual inductance component between each bridge portion 60 and the signal line 20 can be decreased, and the ground potential can also be stabilized. Thus, even though the high-frequency signal transmission line is small in thickness and has the relatively large openings 30 in the ground conductor, unwanted radiation can be reduced and the transmission loss of a high-frequency signal can be decreased.

In addition, since the via-hole conductors B1 to B3 are arranged in the extending direction of each bridge portion 60, occurrence of an unwanted inductance component in each bridge portion 60 can be further suppressed. Particularly, since the length G1 of each opening 30 in the x-axis direction (i.e., the length between the bridge portions 60) is longer than the width W1 of the opening portion in the region A1, occurrence of unwanted radiation can be suppressed even while the area of each opening 30 is increased as much as possible and a predetermined characteristic impedance is accomplished.

In addition, the openings 30 have unit structures that are periodically arranged in the direction in which the signal line 20 extends (in the x-axis direction). Thus, the frequency characteristics of the characteristic impedance of the signal line 20 in each opening 30 can be determined by the length of the opening 30 in the x-axis direction. In other words, the frequency characteristics of the characteristic impedance of the signal line 20 can expand to a higher frequency range as the length G1 of each opening 30 decreases. As the length G1 of each opening 30 increases, the width W1 of the region A1 can be decreased and each opening 30 can be narrowed. Thus, unwanted radiation can be reduced and the transmission loss can be decreased, and hence expansion of the band of and stabilization of the impedance characteristics of the high-frequency signal transmission line 10a can be achieved.

In addition, due to the following reason as well, it is possible to bend and use the high-frequency signal transmission line 10a. In the high-frequency signal transmission line 10a, the region A1 is the easiest to bend since the width of the opening 30 in the y-axis direction is the largest. Meanwhile, each region A2 is the most difficult to bend since no opening 30 is provided therein. Thus, when the high-frequency signal transmission line 10a is bent and used, the region A1 is bent, and each region A2 is hardly bent. Therefore, in the high-frequency signal transmission line 10a, the via-hole conductors B1 to B3 which are more difficult to deform than the dielectric sheets 18 are provided in each region A2. Thus, it is possible to easily bend the region A1.

It is noted that in the high-frequency signal transmission line 10a, a predetermined characteristic impedance can be obtained even by adjusting the magnitude of the distance T1 between the signal line 20 and the ground conductor 22 and the magnitude of the distance T2 between the signal line 20 and the ground conductor 24.

In addition, in the high-frequency signal transmission line 10a, due to the reason described below, the length G1 of each opening 30 in the direction in which the signal line 20 extends is larger than the width W1. More specifically, a transmission mode of a high-frequency signal in the high-frequency signal transmission line 10 is a TEM mode. In the TEM mode, an electric field and a magnetic field are formed so as to be orthogonal to a direction in which a high-frequency signal is transmitted (the x-axis direction). In other words, a magnetic field occurs so as to draw a circle having a center at the signal line 20, and an electric field occurs radially from the signal line 20 toward the ground conductors 22 and 24. Here, when the openings 30 are provided in the ground conductor 22, a magnetic field draws a circle, and thus, merely expands such that the radius thereof increases in each opening 30 and does not greatly leak to the outside of the high-frequency signal transmission line 10a. Meanwhile, a portion of an electric field is radiated to the outside of the high-frequency signal transmission line 10a. Thus, in unwanted radiation of the high-frequency signal transmission line 10a, electric field radiation occupies a large proportion.

Here, since the electric field is orthogonal to the direction in which a high-frequency signal is transmitted (the x-axis direction), when the width W1 of each opening 30 in the y-axis direction increases, an amount of an electric field radiated from each opening 30 increases (unwanted radiation increases). Meanwhile, the characteristic impedance of the high-frequency transmission line 10a can be increased as the width W1 is increased. However, in the high-frequency transmission line 10a, the electric field almost disappears at a distance that is about three times that of the line width of the signal line 20, from the signal line 20 in the direction orthogonal to the direction in which a high-frequency signal is transmitted (the x-axis direction). Thus, even when the width W1 is increased further, the characteristic impedance cannot be increased further. Therefore, when it is considered that unwanted radiation increases as the width W1 increases, it is not preferable to increase the width W1 more than necessary. Further, when the width W1 nearly reaches ½ of the wavelength of a high-frequency signal, electromagnetic waves are radiated as a slot antenna, and unwanted radiation is increased further.

Meanwhile, the area of the signal line 20 that faces the ground conductor 22 can be decreased as the length G1 of each opening 30 in the x-axis direction is increased. Thus, it is possible to increase the line width of the signal line 20. Due to this, an advantage that the high-frequency resistance value in the signal line 20 can be decreased is provided.

In addition, when the length G1 is larger than the width W1, the high-frequency resistance value of a reverse current (eddy current) in the ground conductor 22 is decreased.

Due to the above, the length G1 is preferably larger than the width W1, and is preferably equal to or larger than twice that of the width W1. However, when the length G1 of each opening 30 in the x-axis direction is close to ½ of the wavelength of a high-frequency signal, electromagnetic waves are radiated from the opening 30 as a slot antenna. Thus, it should be taken into consideration that the length G1 needs to be sufficiently short with respect to the wavelength.

High-Frequency Signal Transmission Line According to Second Modified Example

Figure 10:
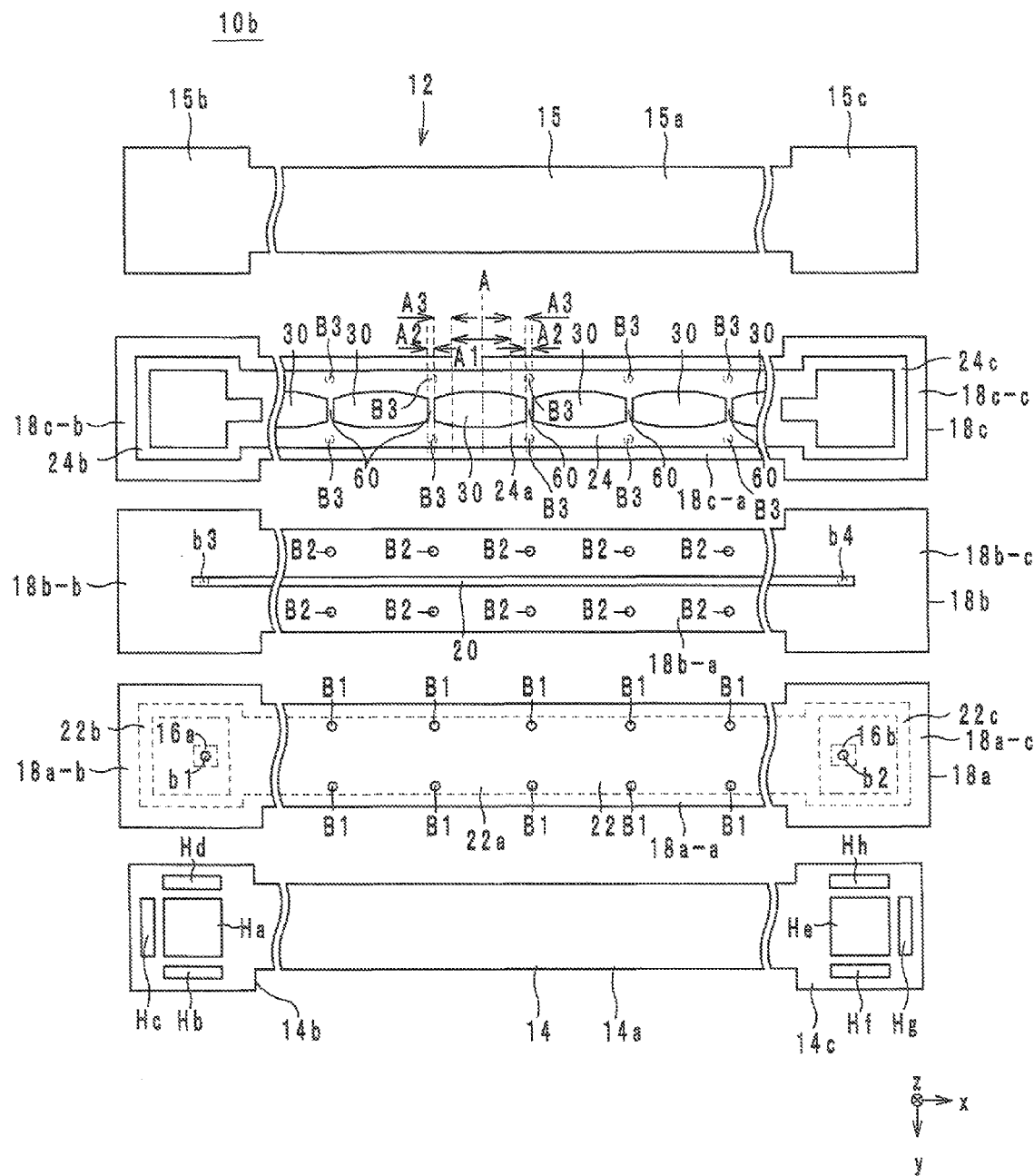
FIG. 10 is an exploded diagram of a laminate of a high-frequency signal transmission line according to a second modified example of a preferred embodiment of the present invention.

Hereinafter, a high-frequency signal transmission line according to a second modified example will be described with reference to the drawing. FIG. 10 is an exploded diagram of the laminate 12 of the high-frequency signal transmission line 10b according to the second modified example.

The difference between the high-frequency signal transmission line 10b and the high-frequency signal transmission line 10a is the shape of each opening 30. More specifically, in the high-frequency signal transmission line 10a, the width of each opening 30 in the y-axis direction changes discontinuously in a phased manner as shown in FIG. 7. In contrast, in the high-frequency signal transmission line 10b, the width of each opening in the y-axis direction changes continuously. More specifically, the width of each opening 30 in the y-axis direction continuously decreases as distance from the center of the opening 30 in the x-axis direction increases. Thus, the magnetic field energy and the characteristic impedance of the signal line 20 change continuously.

It is noted that in the high-frequency signal transmission line 10b, as shown in FIG. 10, a region A1 is provided so as to have a center at the straight line A and is a region including a portion where the width of the opening 30 in the y-axis direction is the width W1. Therefore, the characteristic impedance of the signal line 20 is the maximum value Z1 within the region A1. In addition, a region A2 is provided between each opening 30 and is a region in which the bridge portion 60 is provided. Therefore, the characteristic impedance of the signal line 20 is the minimum value Z2 within the region A2. Further, a region A3 is sandwiched between the region A1 and the region A2 and is a region including a portion where the width of the opening 30 in the y-axis direction is the width W2. Therefore, the characteristic impedance of the signal line 20 is the intermediate value Z3 within the region A3.

Here, the region A1 suffices to include the portion where the width of the opening 30 in the y-axis direction is the width W1, and the region A3 suffices to include the portion where the width of the opening 30 in the y-axis direction is W2. Thus, in the present preferred embodiment, the boundary between the region A1 and the region A3 is not particularly clearly determined. Here, the boundary between the region A1 and the region A3 is located, for example, at a position where the width of the opening 30 in the y-axis direction is (W1+W2)/2.

The high-frequency signal transmission line 10b having the configuration as described above also can be bent and used similarly to the high-frequency signal transmission line 10, unwanted radiation can be reduced, and further transmission loss within the signal line 20 can be suppressed.

High-Frequency Signal Transmission Line According to Third Modified Example

Figure 11:
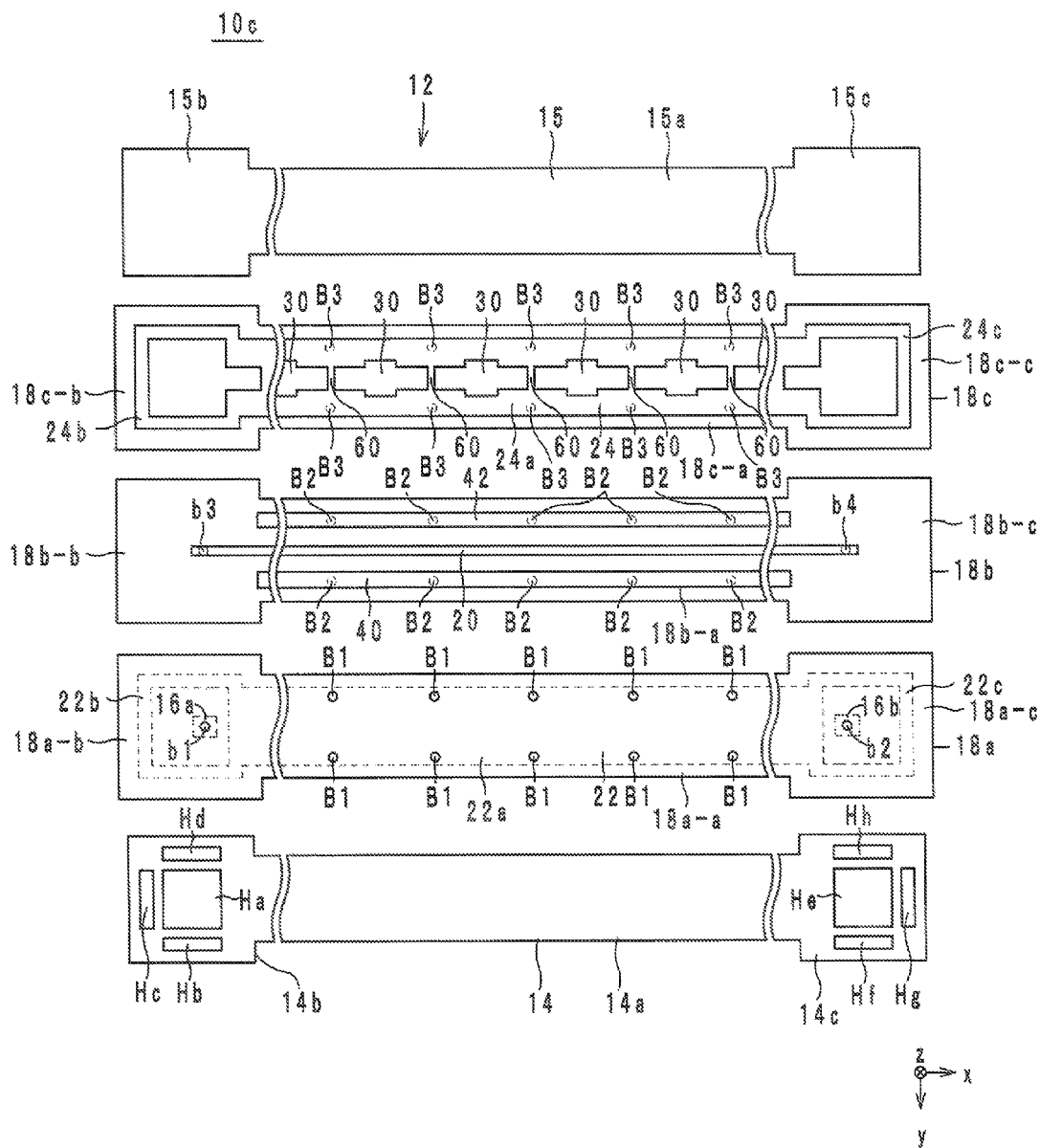
FIG. 11 is an exploded diagram of a laminate of a high-frequency signal transmission line according to a third modified example of a preferred embodiment of the present invention.

Hereinafter, a high-frequency signal transmission line according to a third modified example will be described with reference to the drawing. FIG. 11 is an exploded diagram of the laminate 12 of the high-frequency signal transmission line 10c according to the third modified example.

The difference between the high-frequency signal transmission line 10c and the high-frequency signal transmission line 10a is presence/absence of ground conductors 40 and 42. More specifically, in the high-frequency signal transmission line 10c, the ground conductors 40 and 42 are provided on the front surface of the dielectric sheet 18b. The ground conductor 40 is a rectangular conductor that extends in the x-axis direction on the positive direction side in the y-axis direction with respect to the signal line 20. The ground conductor 40 is connected to the ground conductors 22 and 24 via the via-hole conductors B1 to B3. In addition, the ground conductor 42 is a rectangular conductor that extends in the x-axis direction on the negative direction side in the y-axis direction with respect to the signal line 20. The ground conductor 42 is connected to the ground conductors 22 and 24 via the via-hole conductors B1 to B3.

In the high-frequency signal transmission line 10c as described above, the ground conductors 40 and 42 are provided on both sides of the signal line 20 in the y-axis direction, and thus leakage of unwanted radiation from the signal line 20 to both sides thereof in the y-axis direction is suppressed.

High-Frequency Signal Transmission Line According to Fourth Modified Example

Figure 12:
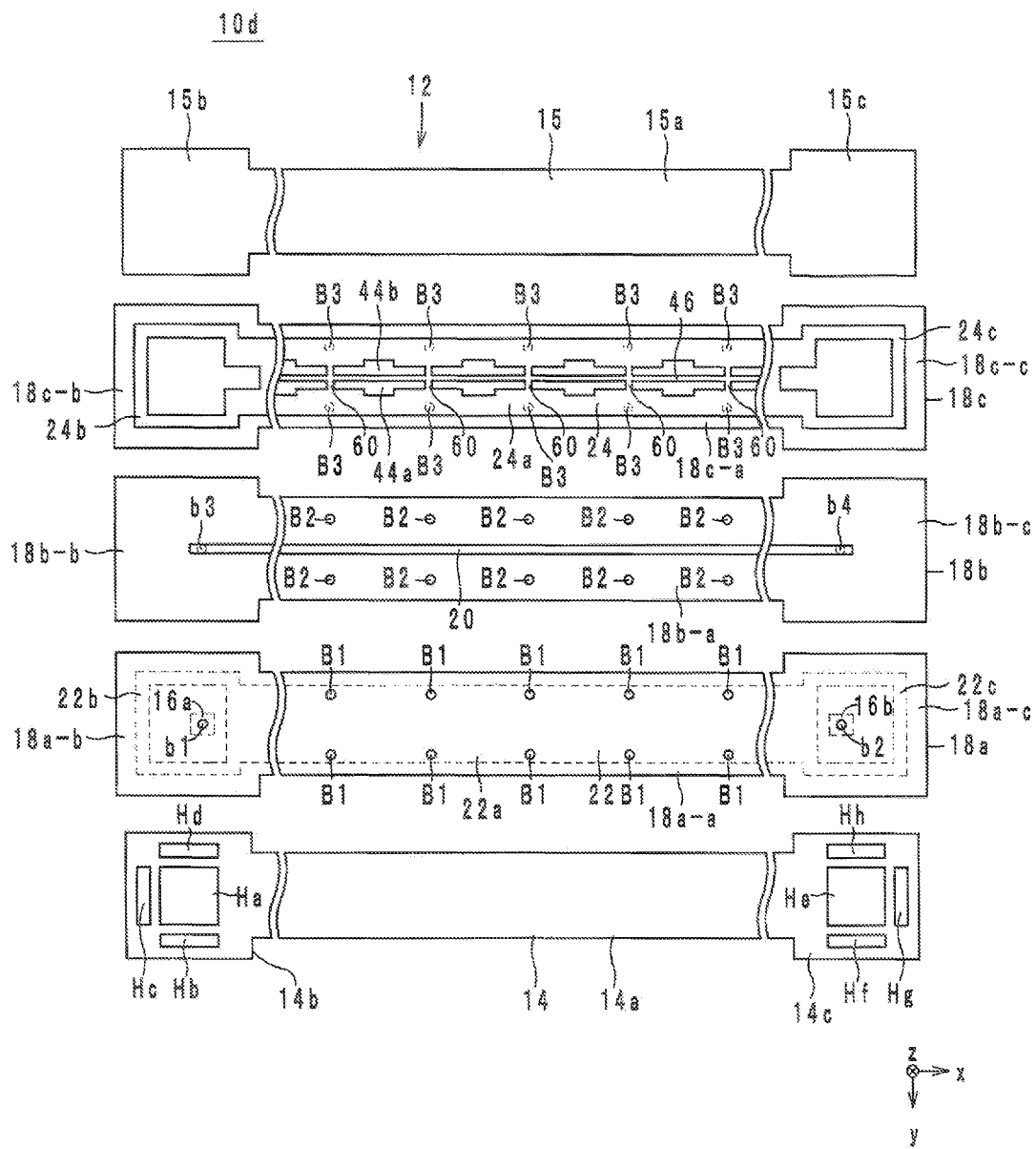
FIG. 12 is an exploded diagram of a laminate of a high-frequency signal transmission line according to a fourth modified example of a preferred embodiment of the present invention.

Hereinafter, a high-frequency signal transmission line according to a fourth modified example will be described with reference to the drawing. FIG. 12 is an exploded diagram of the laminate 12 of the high-frequency signal transmission line 10d according to the fourth modified example.

The difference between the high-frequency signal transmission line 10d and the high-frequency signal transmission line 10a is that the shapes of the openings 30 and the shapes of openings 44a and 44b are different from each other. More specifically, the openings 44a and 44b have a shape obtained by dividing the opening 30 into two portions on the positive direction side and the negative direction side in the y-axis direction. In the high-frequency signal transmission line 10d, a line-shaped conductor 46 is provided so as to extend between the openings 44a and 44b. The line-shaped conductor 46 forms a portion of the ground conductor 24 and overlaps the signal line 20 when being seen in a planar view from the z-axis direction. However, in the high-frequency signal transmission line 10d, the line width of the line-shaped conductor 46 is smaller than the line width of the signal line 20 as shown in FIG. 12. Thus, the signal line 20 protrudes from the line-shaped conductor 46 in a planar view in the z-axis direction. Thus, the signal line 20 overlaps the openings 44a and 44b.

In the high-frequency signal transmission line 10d as described above, a plurality of the openings 44a are provided so as to be arranged along the signal line 20, and a plurality of the openings 44b are provided so as to be arranged along the signal line 20. Thus, the characteristic impedance of the signal line 20 in each region A1 is the maximum value Z1. In addition, the characteristic impedance of the signal line 20 in each region A3 is the intermediate value Z3. Further, the characteristic impedance of the signal line 20 in each region A2 is the minimum value Z2.

High-Frequency Signal Transmission Line According to Fifth Modified Example

Figure 13:
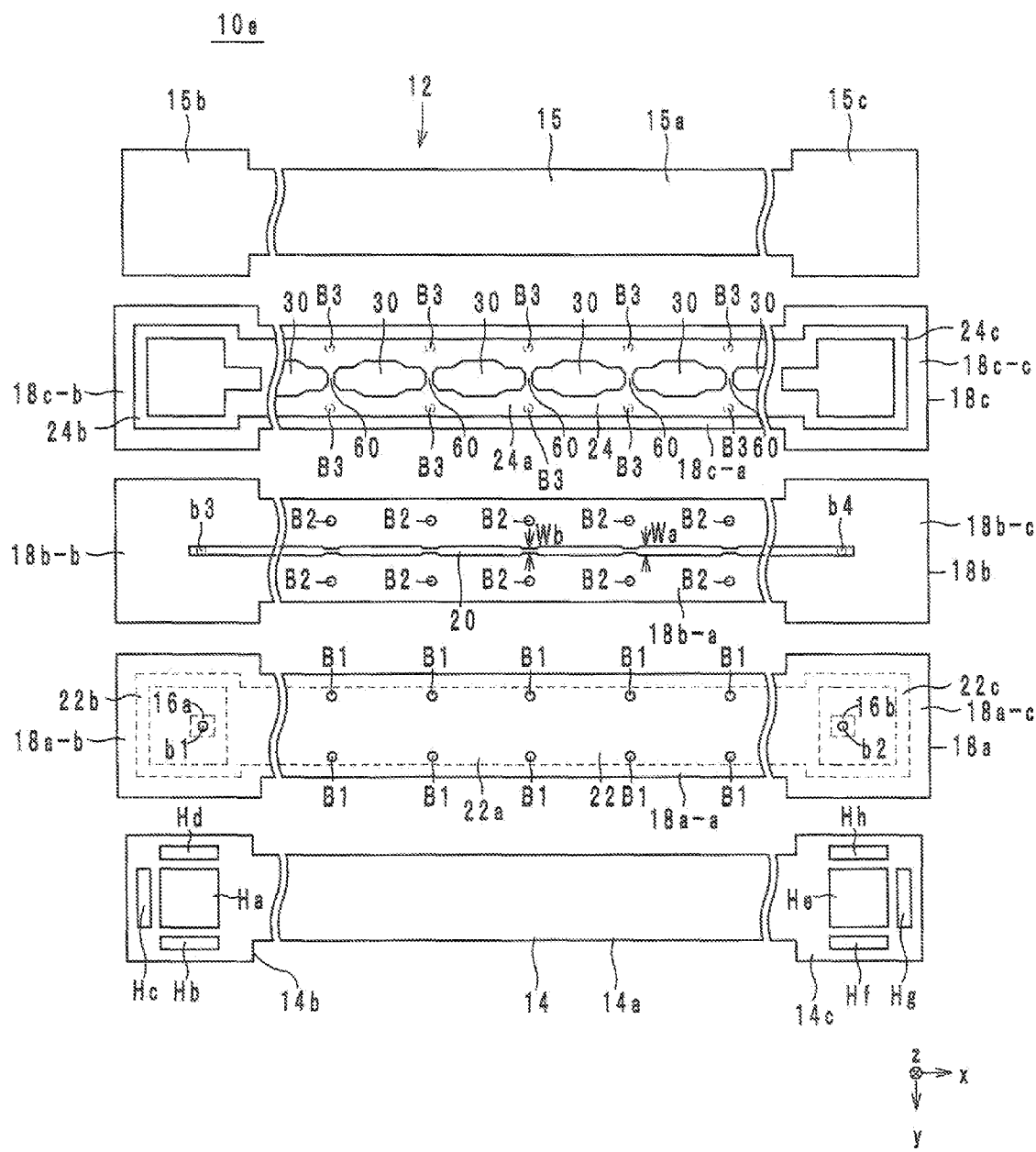
FIG. 13 is an exploded diagram of a laminate of a high-frequency signal transmission line according to a fifth modified example of a preferred embodiment of the present invention.
Figure 14:
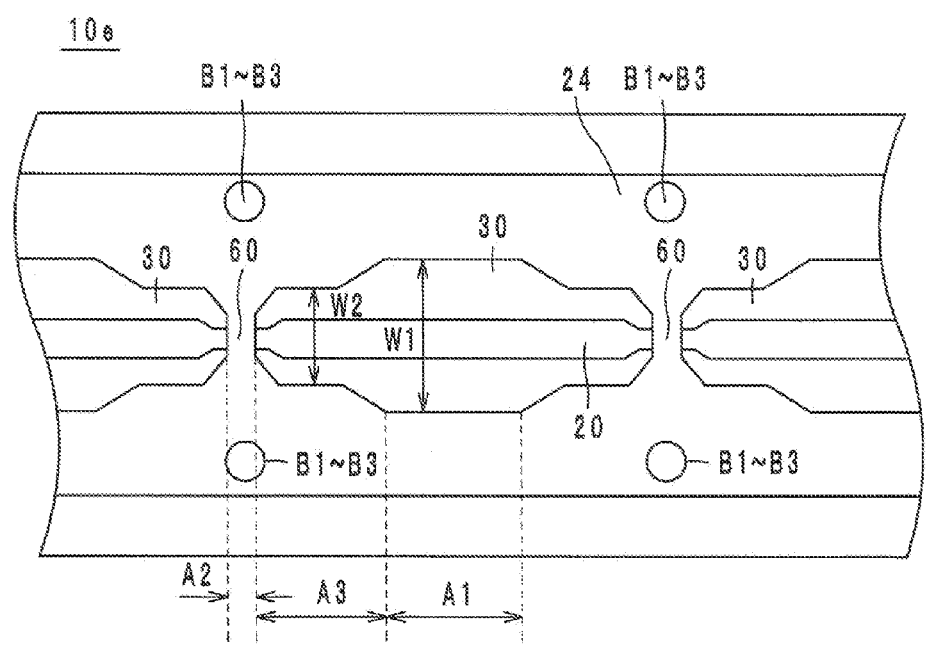
FIG. 14 is a diagram when the high-frequency signal transmission line in FIG. 13 is seen through from a z-axis direction.
Figure 14:

Hereinafter, a high-frequency signal transmission line according to a fifth modified example will be described with reference to the drawings. FIG. 13 is an exploded diagram of the laminate 12 of the high-frequency signal transmission line 10e according to the fifth modified example. FIG. 14 is a diagram when the high-frequency signal transmission line 10e in FIG. 13 is seen through from the z-axis direction.

A first difference between the high-frequency signal transmission line 10e and the high-frequency signal transmission line 10a is that the line width of the signal line 20 in each bridge portion 60 is smaller than the line width of the signal line 20 in a position where the characteristic impedance of the signal line 20 is the maximum value Z1. A second difference between the high-frequency signal transmission line 10e and the high-frequency signal transmission line 10a is that each opening is formed in a tapered shape between a position where the characteristic impedance of the signal line 20 is the intermediate value Z3 (i.e., a position where the width of the opening 30 in the y-axis direction is the width W2) and a position where the characteristic impedance of the signal line 20 is the maximum value Z1 (i.e., a position where the width of the opening 30 in the y-axis direction is the width W1). A third difference between the high-frequency signal transmission line 10e and the high-frequency signal transmission line 10a is that each opening 30 is formed in a tapered shape between a position where the characteristic impedance of the signal line 20 is the intermediate value Z3 (i.e., a position where the width of the opening 30 in the y-axis direction is the width W2) and the bridge portion 60.

First, the definition of the regions A1 to A3 in the high-frequency signal transmission line 10e will be described with reference to FIG. 14. The region A1 is a region where the width of the opening 30 in the y-axis direction is the width W1. The region A2 is a region corresponding to the bridge portion 60. The region A3 is a region that is sandwiched between the region A1 and the region A2 and includes a region where the width of the opening 30 in the y-axis direction is the width W2.

The first difference will be described. As shown in FIGS. 13 and 14, the line width of the signal line 20 in the region A2 is a line width Wb. Meanwhile, the line width of the signal line 20 in the region A1 is a line width Wa larger than the line width Wb. The line width Wa is, for example, 100 to 500 μm. In the present preferred embodiment, the line width Wa is 350 μm. The line width Wb is, for example, 25 to 250 μm. In the present preferred embodiment, the line width Wb is 100 μm. Since the line width of the signal line 20 in the region A2 is smaller than the line width of the signal line 20 in the region A1 as described above, the area where the signal line 20 and the bridge portion 60 overlap each other is decreased. As a result, a stray capacitance occurring between the signal line 20 and the bridge portion 60 is reduced. Further, since the line width of a portion of the signal line 20 which overlaps the opening 30 is the line width Wa, an increase in the inductance value of the portion of the signal line 20 is suppressed. Moreover, since the line width of the entirety of the signal line 20 is not decreased but the line width of the signal line 20 is partially decreased, an increase in the resistance value of the signal line 20 is suppressed.

In addition, the signal line 20 is formed in a tapered shape in a portion where the line width thereof changes. Thus, variation of the resistance value in the portion where the line width of the signal line 20 changes becomes gentle, and occurrence of reflection of a high-frequency signal in the portion where the line width of the signal line 20 changes is suppressed.

The second difference will be described. Each opening 30 is formed in a tapered shape between the position where the width of the opening 30 in the y-axis direction is the width W2 and the position where the width of the opening 30 in the y-axis direction is the width W1. In other words, the end portion of the opening 30 in the x-axis direction in the region A3 is formed in a tapered shape. Thus, the loss of a current flowing through the ground conductor 24 is reduced.

The third difference will be described. Each opening 30 is formed in a tapered shape between the position where the width of the opening 30 in the y-axis direction is the width W2 and the bridge portion 60. Thus, both end portions of the bridge portion 60 in the y-axis direction are formed in tapered shapes. Therefore, the line width of the bridge portion 60 in the x-axis direction is smaller in a portion overlapping the signal line 20 than in the other portions. As a result, a stray capacitance occurring between the bridge portion 60 and the signal line 20 is reduced. In addition, since the line width of the entirety of the bridge portion 60 is not decreased but the line width of the bridge portion 60 is partially decreased, increases in the resistance value and the inductance value of the bridge portion 60 are suppressed.

High-Frequency Signal Transmission Line According to Sixth Modified Example

Figure 15:
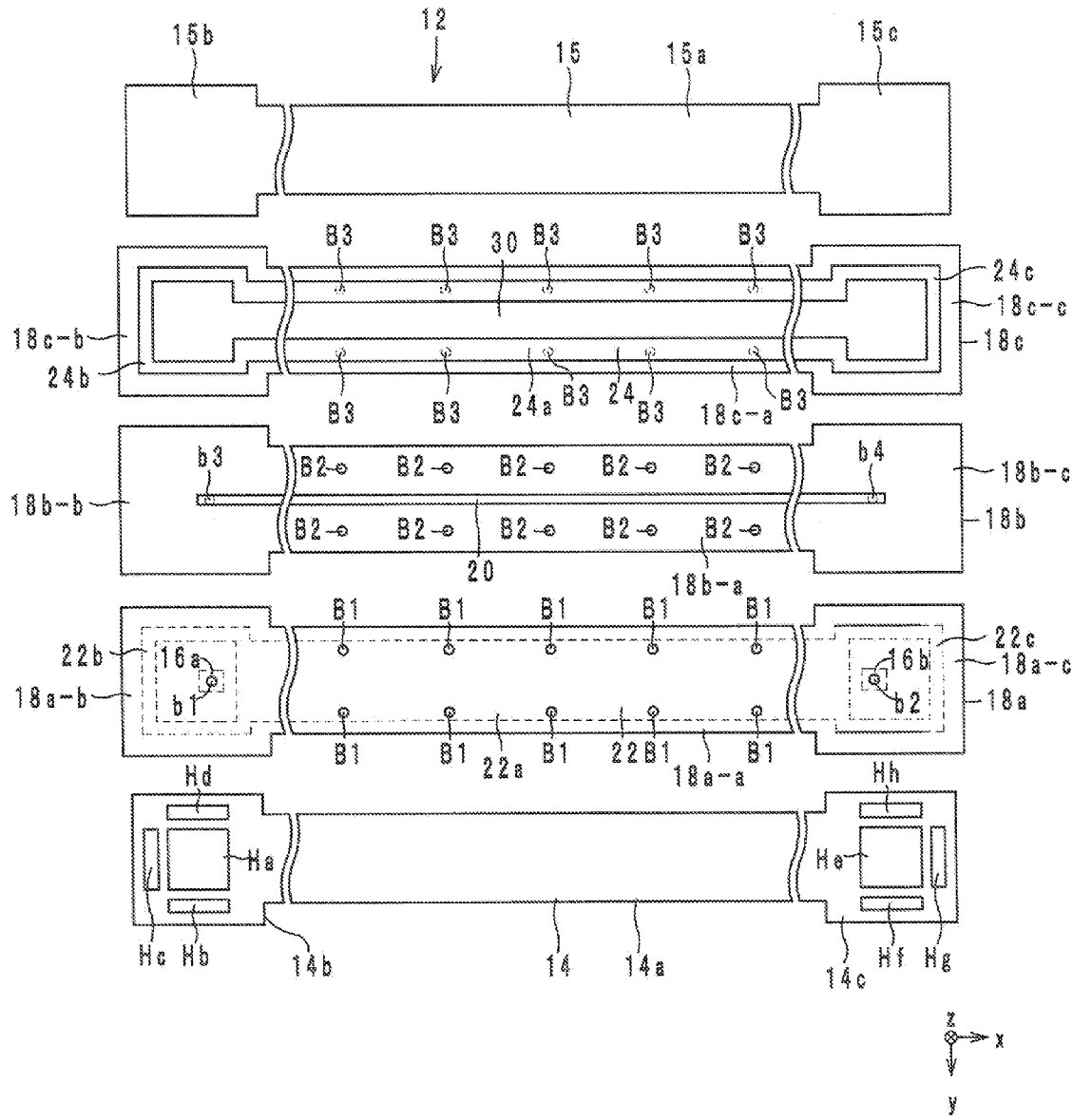
FIG. 15 is an exploded diagram of a laminate of a high-frequency signal transmission line according to a sixth modified example of a preferred embodiment of the present invention.

Hereinafter, a high-frequency signal transmission line according to a sixth modified example will be described with reference to the drawing. FIG. 15 is an exploded diagram of the laminate 12 of the high-frequency signal transmission line 10f according to the sixth modified example.

The difference between the high-frequency signal transmission line 10f and the high-frequency signal transmission line 10 is that no bridge portion 60 is provided in the high-frequency signal transmission line 10f. In other words, the opening 30 in the high-frequency signal transmission line 10f is a slit extending in the x-axis direction. Even in the high-frequency signal transmission line 10f as described above, unwanted radiation is reduced similarly to the high-frequency signal transmission line 10. In addition, since no bridge portion 60 is present, the high-frequency signal transmission line 10f can be bent more easily.

High-Frequency Signal Transmission Line
According to Seventh Modified Example

Figure 16:
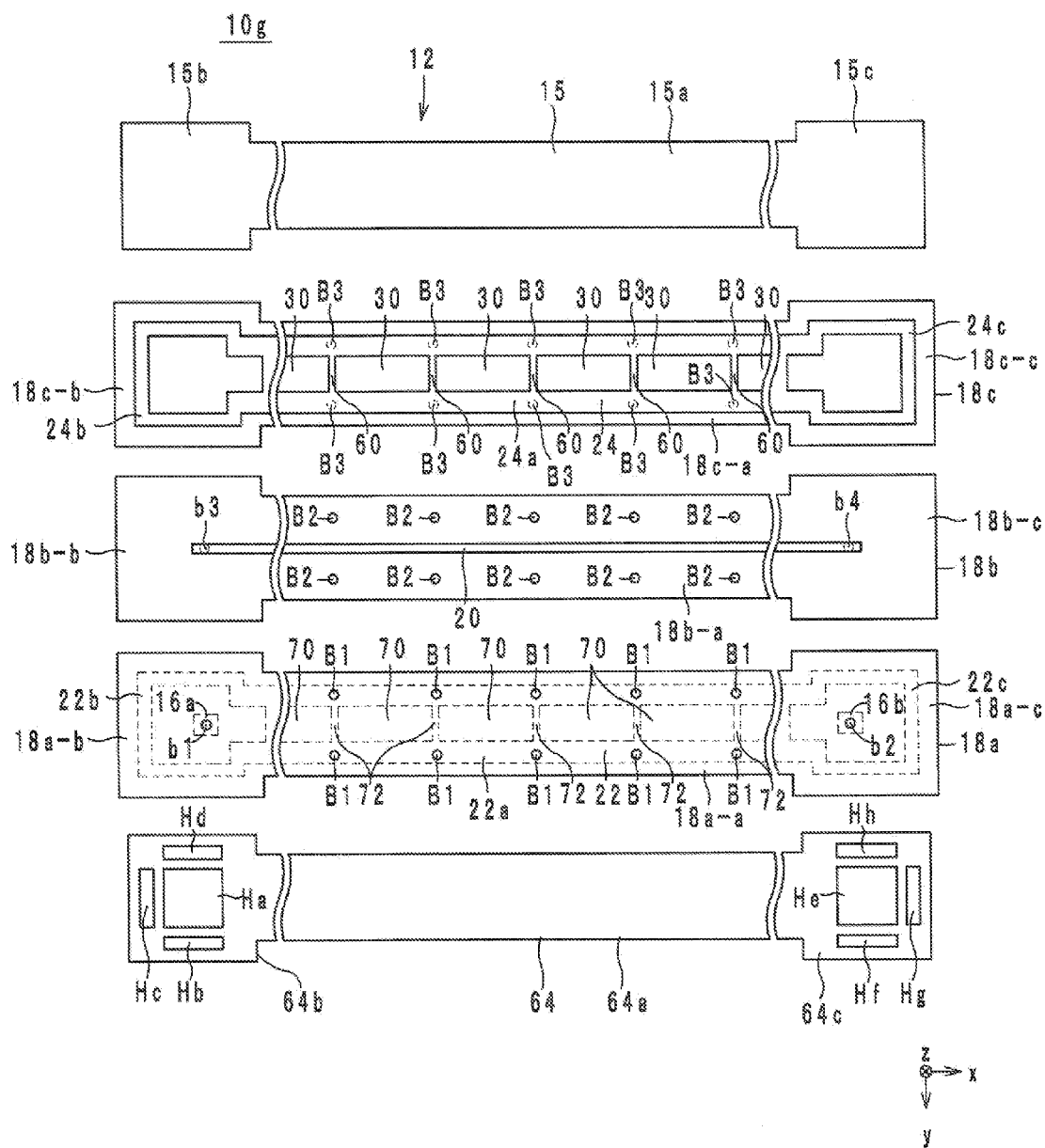
FIG. 16 is an exploded diagram of a laminate of a high-frequency signal transmission line according to a seventh modified example of a preferred embodiment of the present invention.

Hereinafter, a high-frequency signal transmission line according to a seventh modified example will be described with reference to the drawing. FIG. 16 is an exploded diagram of the laminate 12 of the high-frequency signal transmission line 10g according to the seventh modified example.

The difference between the high-frequency signal transmission line 10g and the high-frequency signal transmission line 10 is that openings 70 and bridge portions 72 are provided in the ground conductor 22 and that a high dielectric constant layer 64 is provided.

In the high-frequency signal transmission line 10g, the ground conductor 22 has the same shape as that of the ground conductor 24. In other words, in the ground conductor 22, a plurality of the openings 70 and the bridge portions 72 that overlap the signal line 20 are alternately arranged along the signal line 20.

Further, in the high-frequency signal transmission line 10g, the high dielectric constant layer 64 is provided instead of the protective layer 14. The high dielectric constant layer 64 has the same shape as that of the protective layer 14, and has a relative dielectric constant ∈3 higher than the relative dielectric constant ∈1 of the dielectric element assembly 12. The high dielectric constant layer 64 has the same shape as that of the protective layer 14 and is provided so as to overlap the openings 70. The high dielectric constant layer 64 is formed from, for example, the same material as that of the high dielectric constant layer 15.

In the high-frequency signal transmission line 10g configured as described above as well, unwanted radiation is reduced similarly to the high-frequency signal transmission line 10.

High-Frequency Signal Transmission Line
According to Eighth Modified Example

Figure 17:
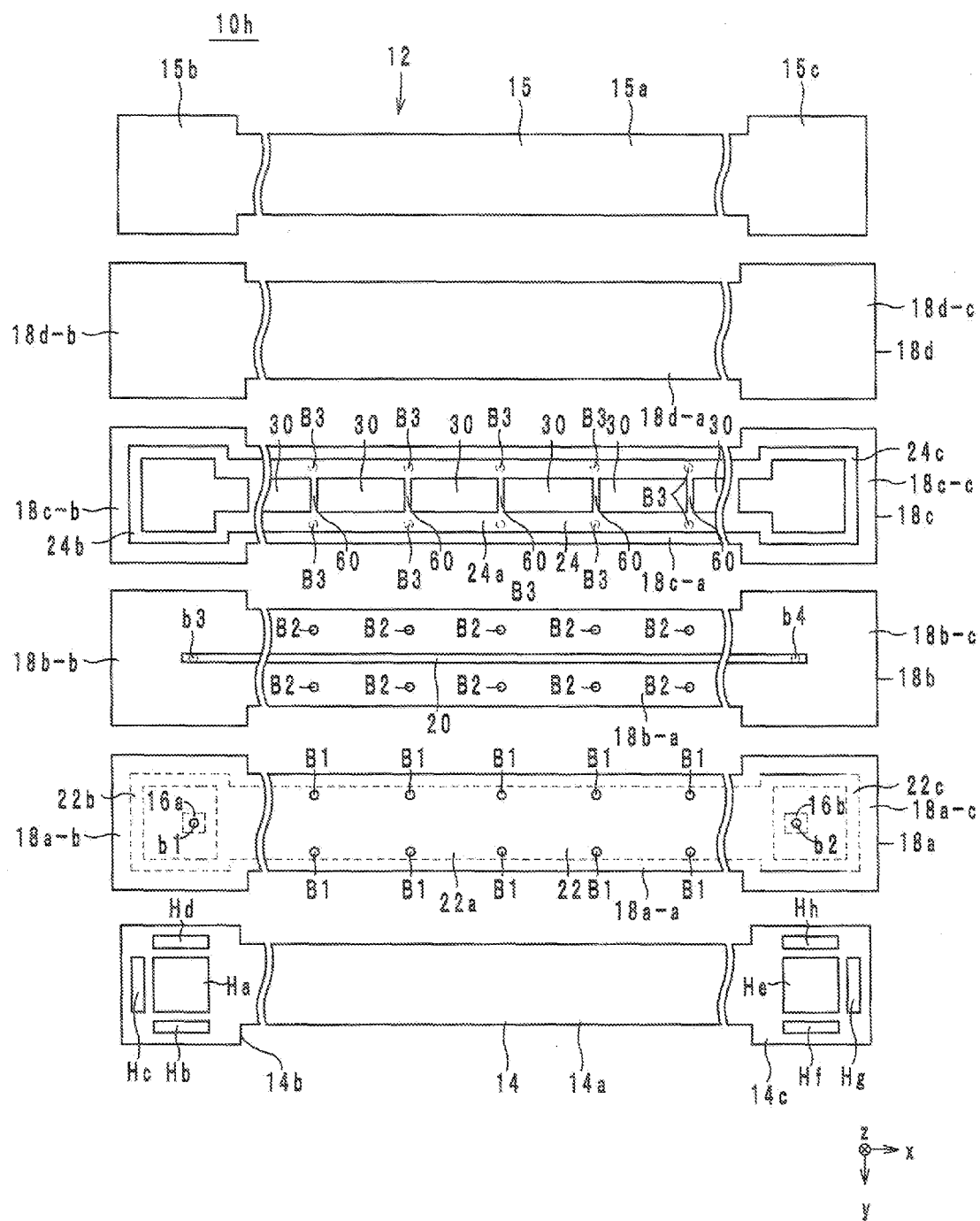
FIG. 17 is an exploded diagram of a laminate of a high-frequency signal transmission line according to an eighth modified example of a preferred embodiment of the present invention.
Figure 18:
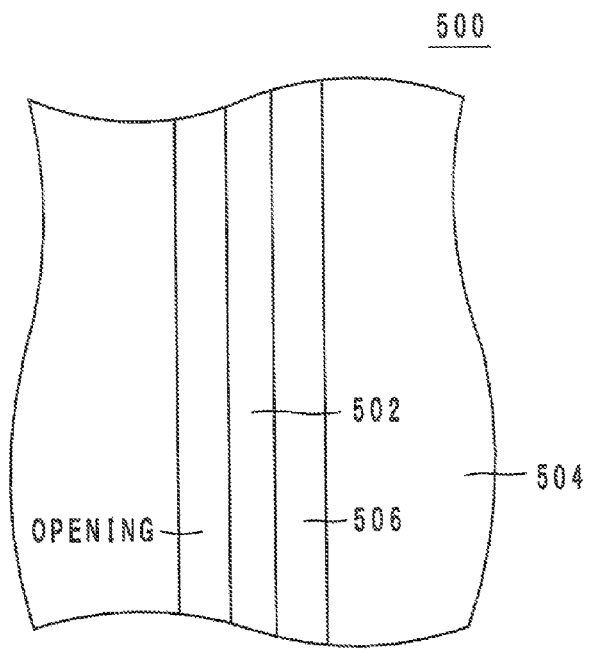
FIG. 18 is a diagram of a high-frequency signal transmission line in which a signal line is exposed from a ground conductor, as seen in a planar view from a lamination direction.
Figure 19:
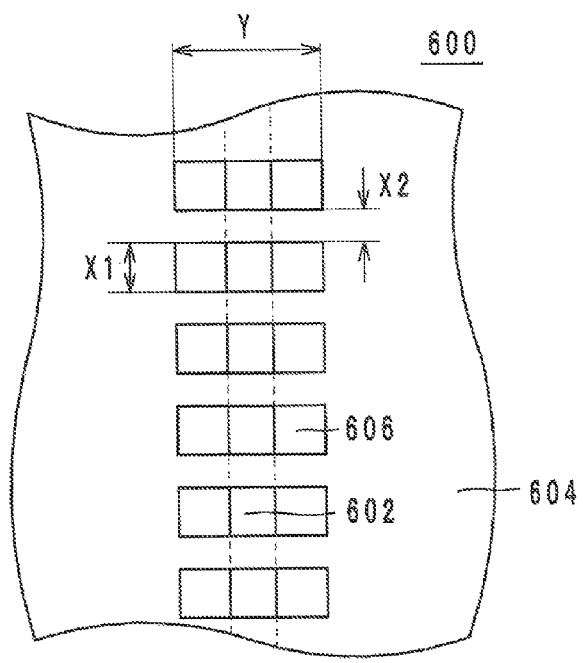
FIG. 19 is a diagram of a flexible board described in Japanese Unexamined Patent Application Publication No. 2007-123740, as seen in a planar view from a lamination direction.

Hereinafter, a high-frequency signal transmission line according to an eighth modified example will be described with reference to the drawing. FIG. 17 is an exploded diagram of the laminate 12 of the high-frequency signal transmission line 10h according to the eighth modified example.

The difference between the high-frequency signal transmission line 10h and the high-frequency signal transmission line 10 is that a dielectric sheet 18d is laminated on the dielectric sheet 18c. More specifically, the dielectric sheet 18d is laminated on the negative direction side of the dielectric sheet 18c in the z-axis direction. The high dielectric constant layer 15 is laminated on the negative direction side of the dielectric sheet 18d in the z-axis direction. Thus, the ground conductor 24 is sandwiched between the dielectric sheets 18c and 18d. In other words, the ground conductor 24 does not have to be provided on the first principal surface of the dielectric element assembly 12.

In the high-frequency signal transmission line 10h configured as described above as well, unwanted radiation is reduced similarly to the high-frequency signal transmission line 10.

Other Preferred Embodiments

A high-frequency signal transmission line according to the present invention is not limited to the high-frequency signal transmission lines 10 and 10a to 10h according to the preferred embodiments described above, and can be modified in a variety of ways within the scope of the present invention.

In each of the high-frequency signal transmission lines 10, 10a to 10e, 10g, and 10h, a plurality of the openings 30 have the same shape. However, the shapes of some of a plurality of the openings 30 may be different from the shapes of the others of a plurality of the openings 30. For example, the lengths of openings 30 in the x-axis direction other than predetermined openings 30 among a plurality of the openings 30 may be larger than the lengths of the predetermined openings 30 in the x-axis direction. Thus, in a region where the predetermined openings 30 are provided, it is possible to easily bend each of the high-frequency signal transmission lines 10, 10a to 10e, 10g, and 10h.

It is noted that the configurations shown in the high-frequency signal transmission lines 10 and 10a to 10h may be combined.

In the high-frequency signal transmission lines 10a to 10e, 10g, and 10h, between the adjacent two bridge portions 60, the characteristic impedance of the signal line 20 varies so as to increase to the minimum value Z2, the intermediate value Z3, and the maximum value Z1 in order and then decrease to the maximum value Z1, the intermediate value Z3, and the minimum value Z2 in order as distance from one bridge portion 60 increases toward the other bridge portion 60. However, between the adjacent two bridge portions 60, the characteristic impedance of the signal line 20 may vary so as to increase to the minimum value Z2, the intermediate value Z3, and the maximum value Z1 in order and then decrease to the maximum value Z1, an intermediate value Z4, and the minimum value Z2 in order as distance from one bridge portion 60 increases toward the other bridge portion 60. In other words, the intermediate value Z3 and the intermediate value Z4 may be different from each other. For example, the openings 30, 44a, and 44b may have shapes that are not line-symmetrical about the straight line A. However, the intermediate value Z4 has to be higher than the minimum value Z2 and lower than the maximum value Z1.

In addition, the minimum value Z2 may be different between the adjacent two bridge portions 60. In other words, as long as the entireties of the high-frequency signal transmission lines 10a to 10f are adjusted to predetermined characteristic impedances, all the minimum values Z2 do not have to be the same. However, the minimum value Z2 on one bridge portion 60 side has to be lower than the intermediate value Z3, and the minimum value Z2 on the other bridge portion 60 side has to be lower than the intermediate value Z4.

In addition, the connectors 100a and 100b may be provided on the first principal surface side (front surface side) of the dielectric element assembly 12.

INDUSTRIAL APPLICABILITY

As described above, the present invention is useful for high-frequency signal transmission lines, and particularly, is excellent in being able to reduce unwanted radiation.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency signal transmission line comprising:
an element assembly having a first relative dielectric constant and having a first principal surface and a second principal surface;
a line-shaped signal line provided within the element assembly;
a first ground conductor provided in the element assembly and on the first principal surface side with respect to the signal line and facing the signal line, the first ground conductor being provided with a first opening that overlaps the signal line; and
a first high dielectric constant layer having a second relative dielectric constant higher than the first relative dielectric constant and provided on the first principal surface so as to overlap the first opening.

2. The high-frequency signal transmission line according to claim 1, wherein
the first ground conductor is provided on the first principal surface, and
the first high dielectric constant layer covers the first ground conductor.

3. The high-frequency signal transmission line according to claim 1, wherein the element assembly is composed of a plurality of laminated insulating material layers.

4. The high-frequency signal transmission line according to claim 1, wherein the element assembly has flexibility.

5. The high-frequency signal transmission line according to claim 1, further comprising a second ground conductor facing the first ground conductor across the signal line in the element assembly.

6. The high-frequency signal transmission line according to claim 5, wherein
the second ground conductor is provided with a second opening that overlaps the signal line, the high-frequency signal transmission line further comprises a second high dielectric constant layer having a third relative dielectric constant higher than the first relative dielectric constant and provided on the second principal surface so as to overlap the second opening.

7. An electronic device comprising:
a component; and
a high-frequency signal transmission line comprising:
an element assembly having a first relative dielectric constant and having a first principal surface and a second principal surface;
a line-shaped signal line provided within the element assembly;
a first ground conductor provided in the element assembly and on the first principal surface side with respect to the signal line and facing the signal line, the first ground conductor being provided with a first opening that overlaps the signal line;
a second ground conductor facing the first ground conductor across the signal line in the element assembly; and
a first high dielectric constant layer having a second relative dielectric constant higher than the first relative dielectric constant and provided on the first principal surface so as to overlap with first opening; wherein
the high-frequency signal transmission line is disposed such that the second principal surface contacts with the component.

8. The electronic device according to claim 7, wherein the element assembly is composed of a plurality of laminated insulating material layers.

9. The electronic device according to claim 7, wherein the element assembly has flexibility.

10. The electronic device according to claim 7, wherein the component is a battery pack.

11. The electronic device according to claim 7, wherein the first principal surface of the high-frequency signal transmission line is opposed to a casing of the electronic device at a distance.

* * * * *